(12) United States Patent
Lin

(10) Patent No.: US 9,996,654 B2
(45) Date of Patent: Jun. 12, 2018

(54) TRANSISTOR PLASMA CHARGING EVALUATOR

(71) Applicant: Wallace W Lin, San Jose, CA (US)

(72) Inventor: Wallace W Lin, San Jose, CA (US)

( * ) Notice: Subject to any disclaimer, the term of this patent is extended or adjusted under 35 U.S.C. 154(b) by 18 days.

(21) Appl. No.: 14/856,578

(22) Filed: Sep. 17, 2015

(65) Prior Publication Data

US 2016/0180010 A1    Jun. 23, 2016

Related U.S. Application Data

(60) Provisional application No. 62/124,486, filed on Dec. 22, 2014.

(51) Int. Cl.
  *G06F 17/50* (2006.01)
  *H01L 27/06* (2006.01)
  *H01L 27/02* (2006.01)

(52) U.S. Cl.
  CPC ...... *G06F 17/5081* (2013.01); *G06F 17/5036* (2013.01); *G06F 17/5063* (2013.01); *H01L 27/0255* (2013.01); *H01L 27/0617* (2013.01)

(58) Field of Classification Search
  CPC ............. G06F 17/5036; G06F 17/5063; G06F 17/5081; H01L 27/0255
  See application file for complete search history.

(56) References Cited

U.S. PATENT DOCUMENTS

| | | | | |
|---|---|---|---|---|
| 5,600,578 A * | 2/1997 | Fang | .................. | G01R 31/2621 324/762.09 |
| 5,726,458 A * | 3/1998 | Bui | .................. | H01L 21/32137 257/204 |
| 6,414,358 B1 * | 7/2002 | Lin | .................... | H01L 27/0255 257/356 |
| 6,433,553 B1 * | 8/2002 | Goeckner | .......... | G01R 19/0061 324/459 |
| 6,566,716 B2 * | 5/2003 | Lin | ........................ | H01L 23/48 257/288 |
| 6,624,480 B2 * | 9/2003 | Lin | .................... | H01L 27/0251 257/355 |
| 6,713,817 B2 * | 3/2004 | Kitagawa | ............ | H01L 27/0629 257/360 |
| 6,747,471 B1 * | 6/2004 | Chen | .................. | G01R 31/2856 324/750.05 |
| 6,809,031 B1 * | 10/2004 | Lacy | ........................ | H01L 22/34 257/E21.243 |
| 6,862,723 B1 * | 3/2005 | Wang | .................. | G06F 17/5081 716/112 |
| 7,114,140 B2 * | 9/2006 | Ishikura | .............. | G06F 17/5072 257/E23.02 |

(Continued)

*Primary Examiner* — Helen Rossoshek

(57) ABSTRACT

A computer-implemented method capable of evaluating a plasma-induced charging effect to a transistor in a plasma-based process for a dielectric layer performed above the transistor on which a metal layer is formed is provided. The method may include receiving parameters relating to the transistor, receiving parameters relating to an interconnection, receiving parameters relating to the plasma-based process, assigning first potentials to terminals of the transistor, calculating second potentials at the terminals of the transistor, and determining a degradation state of the transistor according to the second potentials at the terminals of the transistor.

11 Claims, 54 Drawing Sheets

(56) References Cited

U.S. PATENT DOCUMENTS

| | | | | |
|---|---|---|---|---|
| 7,174,527 B2* | 2/2007 | Itou | | H01L 22/14 257/E21.531 |
| 7,721,244 B2* | 5/2010 | Ono | | G06F 17/5077 703/14 |
| 7,952,392 B2* | 5/2011 | Koyama | | H01L 27/1225 257/268 |
| 7,972,915 B2* | 7/2011 | Chen | | H01L 21/8252 257/192 |
| 8,001,516 B2* | 8/2011 | Smith | | G06F 17/5068 716/100 |
| 8,413,094 B2* | 4/2013 | Abadeer | | G06F 17/5068 257/314 |
| 8,450,144 B2* | 5/2013 | Sakata | | H01L 21/02554 257/E21.46 |
| 2002/0142526 A1* | 10/2002 | Khare | | H01L 29/78612 438/152 |
| 2003/0200071 A1* | 10/2003 | Zhang | | G06F 17/5036 703/15 |
| 2004/0088068 A1* | 5/2004 | Kadosh | | G05B 19/41875 700/108 |
| 2006/0225007 A1* | 10/2006 | Wang | | G06F 17/5036 716/112 |
| 2009/0031271 A1* | 1/2009 | White | | G06F 17/5068 716/122 |
| 2012/0117519 A1* | 5/2012 | Parikh | | G06F 17/5036 716/53 |
| 2013/0258784 A1* | 10/2013 | Lue | | G11C 16/0483 365/185.18 |
| 2016/0179995 A1* | 6/2016 | Lin | | G06F 17/5063 716/135 |
| 2016/0180011 A1* | 6/2016 | Lin | | G06F 17/5081 716/112 |
| 2016/0267217 A1* | 9/2016 | Takemura | | G06F 17/5081 |
| 2016/0276229 A1* | 9/2016 | Lin | | H01L 22/14 |
| 2016/0329258 A1* | 11/2016 | Lin | | H01L 22/34 |

* cited by examiner

| | |
|---|---|
| Plasma Charging Type | "+" or "−" |
| Transistor Type | P-MOSFET or N-MOSFET |
| Protection Device | With or Without Junction diode or Gated diode |
| Gate Oxide Thickness ($t_{OX}$) | 5 to 1000 Å |
| Plasma Loading Characteristics, $J_{SC}$ | $10^{-15}$ to $10^1$ Amp/cm$^2$ |
| Plasma Loading Characteristics, $V_{OC}$ | 0 to 500V |
| Plasma Loading Shape Factor (sf) | 0.0001 to 1 |
| Interconnect Metal Layer $N_M$ at which Simulations are performed | $N_M$ = 1 to 15 |
| ILD Layer $N_{ILD}$ at which Simulations are performed | $N_{ILD}$ = 0 to 15 |
| ILD Layer thickness $t_{ILD}$ | $t_{ILD}$ = 0 to 20000 Å |
| Area of interconnect Metal at Transistor terminals at Interconnect Metal Layer $N_M$ | 0 to 20000μm$^2$ |
| Other Process Parameters | Include doping concentration in source, drain and NW region |
| Other Device Design Parameters | Include connectivity of transistor terminals and fully- or partial- or non-overlap of interconnect metals in vertical dimension |

Fig. 8(a)

| 2-D | Y (Output) | X (Input) |
|---|---|---|
| | $V_g$ $V_s$ $V_d$ $V_{nw}$ $V_{gs}$ $V_{gd}$ $V_{gnw}$ | $A_g$ $A_s$ $A_d$ $A_{nw}$ $t_{ILD}$ |

| 3-D | Z (Output) | X, Y (Input) |
|---|---|---|
| | $V_g$ $V_s$ $V_d$ $V_{nw}$ $V_{gs}$ $V_{gd}$ $V_{gnw}$ | $A_g, A_s$ $A_g, A_d$ $A_g, A_{nw}$ $A_s, A_d$ $A_s, A_{nw}$ $A_d, A_{nw}$ $t_{ILD}, A_g$ $t_{ILD}, A_g$ $t_{ILD}, A_d$ $t_{ILD}, A_{nw}$ |

Fig. 8(b)

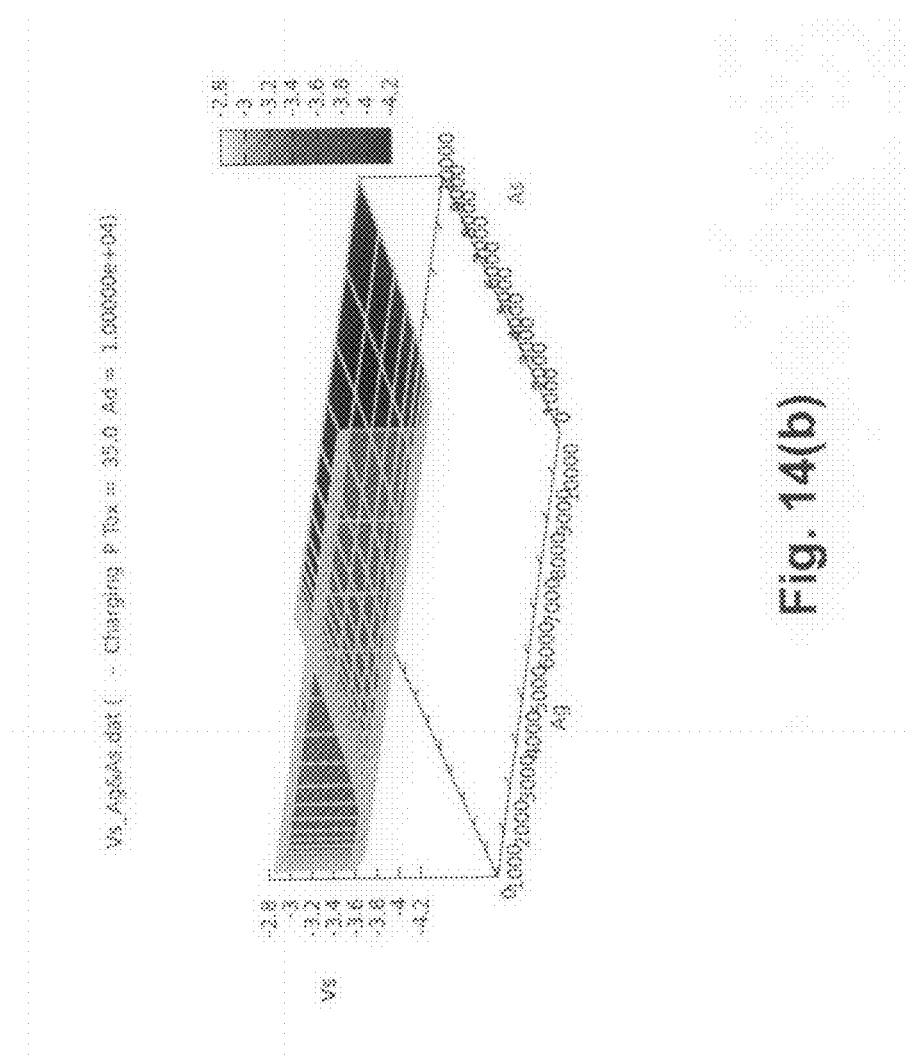

TRANSISTOR PLASMA CHARGING EVALUATOR

CROSS-REFERENCE TO RELATED APPLICATION

This application claims the benefit of U.S. Provisional Application No. 62/124,486, filed on Dec. 22, 2014.

BACKGROUND

1. Technical Field

The present disclosure presents a computer-aided-design (CAD) tool that is capable of estimating the voltage across the gate oxide of a MOS (metal oxide semiconductor) transistor exposed to plasma during semiconductor integrated-circuit (IC) manufacturing process. Given the internal and external conditions applying to the transistor located inside the IC, the tool simulates and evaluates the plasma induced charging effect to the transistor during a plasma-based IC manufacturing process. These internal and external conditions include transistor internal physical features, transistor external configuration and connectivity, parameters related to transistor front-end process manufacturing the transistors, and parameters related to transistor back-end plasma involved process during interconnect patterning.

The disclosed tool here will be essential for equipment vendors developing charging-minimized plasma related semiconductor manufacturing equipment and process in order to achieve high manufacturability and yield for IC products. The tool will also help device engineers improve transistor design, internally and externally, to attain more accurate and relaxed plasma-charging metal (or interconnect) design rules for circuit design. It helps process engineers fine tune process recipes for minimizing plasma charging damages in transistor gate oxides as well.

2. Description of Related Art

Plasma process induced charging damages in gate oxide of transistors has long been a reliability concern in semiconductor industry. Such damage sometimes can cause failure in an entire product line during manufacturing process, incurring significant operating loss for business. The plasma charging phenomena are rather complicated because of involvement of many factors. For example, although the conditions of the plasma sources can obviously inflict the damage to transistor gate oxides, the process parameters and the internal and external physical features of the transistor itself can cause gate oxide damages as well in some cases even during a normal operating condition of a plasma source.

Though the problems have seen some alleviation in recent process technology nodes employing thinner gate oxides, they continue to exist persistently. Such concern is more obvious and serious in particular for semiconductor foundries which run an array of different process nodes from the very old 0.35 µm to the very advanced sub-20 nm process. The wide span of the process nodes here requires the use of a broad range of gate oxide thickness including a range between 35 to 60 Å which, over the years during process technology development for silicon MOSFET transistors, has seen the most devastating plasma charging induced transistor degradation.

In the past several decades, it seems that there was not much synergy between the plasma-process equipment vendors, the foundries, and the individual semiconductor manufacturers in looking into the plasma charging related issues with a more comprehensive and systematic approach. The equipment vendors tackling such issues are probably lack of more adequate information on transistors under development by the foundries and the individual semiconductor manufacturers due to the latter being reluctant to give out proprietary transistor development information. On the other hand, the foundries and the individual semiconductor manufacturers, through tremendous efforts, must learn and perfect their knowledge in the characteristics of the plasma process equipments they acquired and then fine tune performance of the plasma equipments such that the transistors they made in their IC chips suffer less damages in their gate oxides. Such an approach in the industry has been extremely expensive due to the implementation and experimentation of the test devices in the manufacturing environment. The culprit of such situation may be attributed to the lack of an inexpensive means of understanding completely and providing solutions to this decade-long industry reliability problem. A simulation and evaluation computer-aided-design tool can offer a good solution to this. However, the tool must incorporate comprehensive physical models governing the plasma charging behaviors of the transistor. It has to be capable of accurately estimating the voltage across the transistor gate oxide under any internal and external process and device conditions of the transistor exposed to the plasma sources

SUMMARY

This disclosure here is a CAD simulation tool aiming at the IC industry. The tool simulates and evaluates effect of the interconnect metals connected to the external nodes of the transistors on transistor gate oxide reliability in integrated circuits during backend plasma involved metal patterning process. Since the evaluation takes into account the effect of the plasma loading characteristics of the plasma processing equipments, the tool can be used by plasma equipment vendors to assess and enhance their plasma equipments. The disclosed tool also takes into account the effect of the device internal junctions and external connectivity, therefore the device and process engineers can benefit from using this tool to fine-tune the process recipes and the transistor design. Circuit designers can be benefited as well since the evaluated results of the impact of interconnect metal on transistor gate oxide reliability can help them design circuits with interconnect layouts that can minimize the plasma charging induced circuit damage.

The core of the disclosed transistor plasma charging evaluator is a simulation engine which does the major calculation and analysis task. The engine incorporates latest most advanced multiple-terminal transistor charging models. In order to accurately take into account all possible component currents in the transistor during the plasma event, the engine also implements a compact transistor model similar to those (SPICE, BSIM2, BSIM3, BSIM4, etc.) used for circuit simulation. Comprehensive physical models governing transistor gate oxide current, transistor internal currents in the regions including source-to-substrate (or source-to-NW if PMOS transistor, where NW denotes N-Well), drain-to-substrate (or NW) and NW-to-substrate junction, and depletion region underneath the gate channel, etc, are also incorporated into the CSE. Numerical solving schemes that solve complicated physics-related mathematical equations are implemented in the tool. Surrounding the simulator engine are the pre-processing units that pre-process the inputs describing characteristics associated with the plasma source, the transistor and the interconnect metals.

A post-processing unit processes the evaluation results. With the options for users to choose, it can provide 2-D and 3-D graphs that can be visualized by users or it can generate data with a structure specified by users for their own purpose.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows:

FIG. 8($a$) shows parameters and their possible value ranges used in the plasma charging evaluator according to one embodiment of the present disclosure;

FIG. 8($b$) shows 2-D and 3-D input and output parameters of the plasma charging evaluator according to one embodiment of the present disclosure;

FIGS. 9($d$) and 9($e$) show the effect of the thickness of the ILD-1 film on the charging voltages across the transistor gate oxide in the gate-to-source and gate-to-drain overlap regions according to one embodiment of the present disclosure;

FIGS. 10($d$) and 10($e$) are the 2D plots derived from FIGS. 9($a$) and 10($a$) at Ag=10000 μm$^2$ according to one embodiment of the present disclosure;

FIGS. 10($f$) and 10($g$) show the effect of the thickness of the ILD-6 film on the charging voltages across transistor gate oxide in the gate-to-source and gate-to-drain overlap regions according to one embodiment of the present disclosure;

FIG. 10($h$) summarizes the effect of the ILD-6 film thickness on the N-MOSFET;

FIGS. 15($e$) to 15($h$) show the simulated 3-D plots of the charging voltages across the transistor gate oxide in the gate-to-channel overlap region (Vgc) versus the area of the metal-6 metal at the source and drain terminals with the gate oxide thickness at 25A, 35A, 50A, and 80A, respectively;

FIG. 15($i$) summarizes the maximum electric field of the gate oxide in the gate-to-source overlap region and in the gate-to-channel overlap region versus the transistor gate oxide thickness according to one embodiment of the present disclosure;

FIGS. 16($d$) to 16($f$) show Vgc versus Voc of the plasma loading characteristics at the same 5, 30, and 80V, respectively; and FIG. 16($g$) summarizes the relationship between the gate oxide charging voltages (Vgs, Vgd and Vgc) and the plasma open-circuit voltage (Voc), which is extended to 100V according to one embodiment of the present disclosure.

DESCRIPTION OF THE EXEMPLARY EMBODIMENTS

The aforementioned and other technical contents, features, and efficacies will be shown in the following detailed descriptions of a preferred embodiment corresponding with the reference figures.

Figure 1:
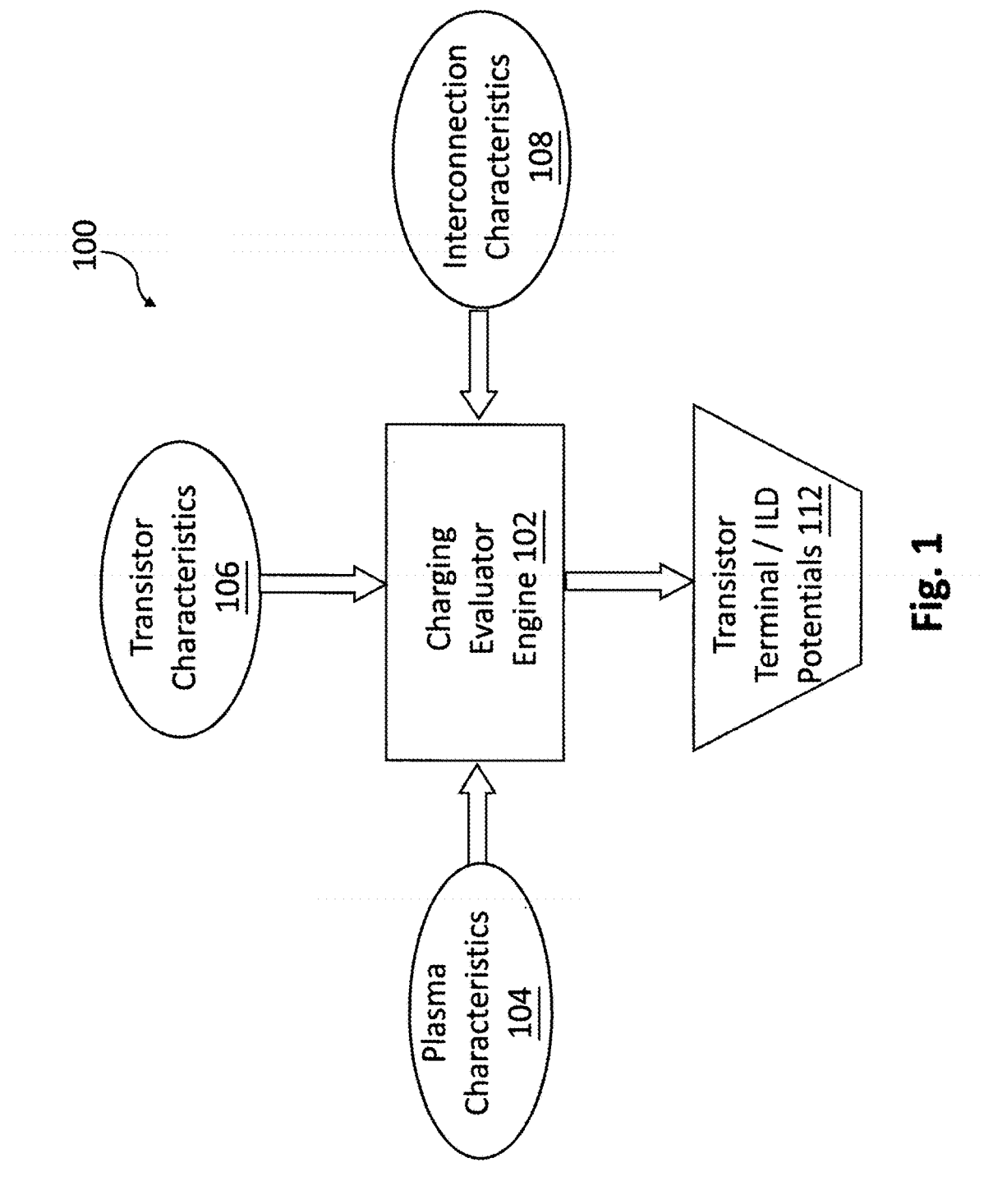
FIG. 1 shows a simplified block diagram of a plasma charging evaluator according to one embodiment of the present disclosure.

FIG. 1 illustrates a simplified block diagram of a transistor plasma charging evaluator 100 according to one embodiment of the present disclosure. The transistor plasma charging evaluator 100 may include a charging evaluator engine 102. The evaluator engine 102 incorporates comprehensive physical models governing the plasma charging behaviors of the transistors. The charging evaluator engine 102 receives at least three groups of inputs that affect the charging behaviors of the transistor. The three groups of the inputs may include (i) characteristics of the plasma source (e.g., plasma characteristics 104) that includes the polarity of the plasma, the plasma loading characteristics, the plasma illumination intensity, etc., (ii) characteristics of the transistor 106, which includes the transistor type, the transistor internal and external physical features, the transistor leakage-related parameters associated with its internal features, the transistor external connectivity and associated parameters, the transistor gate oxide thickness, gate oxide leakage behavior and gate oxide degradation threshold, etc., and (iii) characteristics of interconnection (e.g., interconnection characteristics 106) that define the outer connection of the transistor, including the features and connectivity of the interconnect metal and the property of the inter(-metal)-layer dielectrics (ILD). The charging evaluator engine 102 may perform analysis based on the information provided from the three groups of the inputs. The evaluator 100 may provide an analysis result as the output which is a group of parameters indicating electrical potentials at transistor terminals such as a transistors gate, drain, source and N-well (NW) (when the transistor is a PMOS transistor) and at a top surface of an in-processing ILD layer right above where interconnect metals are connected at the transistor terminals. Based on these electrical potentials at various terminals, detailed information such as the potential drop across transistor gate oxide along a transistor channel region and at the gate-to-source and gate-to-drain overlap region and the potential drop across the in-processing ILD layers at the locations of the transistor gate, source, drain and NW may then be calculated.

If the in-processing ILD process is a deposition process and its ILD growth rate with time is known, the charging evaluator 100 of the present disclosure may perform the analysis of the trend of the potential drop across the in-processing ILD layers versus the ILD deposition time. Vice versa, if the in-processing ILD process is a etch process and information of its ILD etch rate with time is available the charging evaluator 100 of the present disclosure may also perform the analysis of the trend of the potential drop across the in-processing ILD layers versus the ILD etch time.

Figure 2:
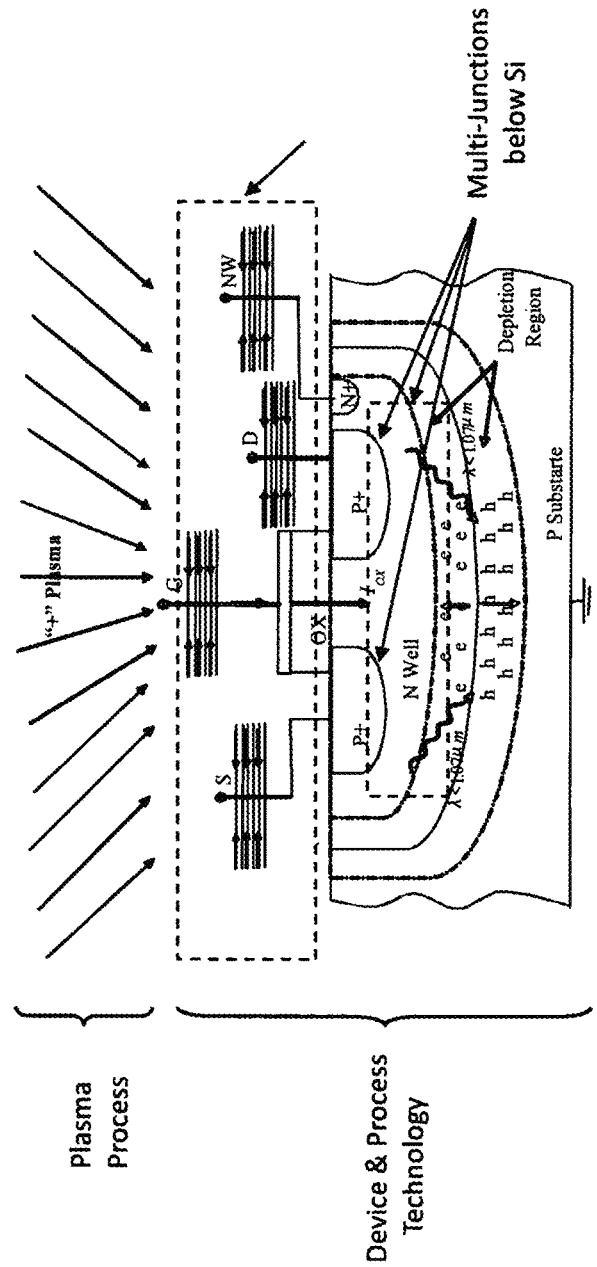
FIG. 2 shows a cross-sectional view of a PMOSFET transistor and external interconnect metals during a plasma-based IC manufacturing process according to one embodiment of the present disclosure.

Please refer to FIG. 2 showing a cross-sectional view of a PMOSFET transistor and external interconnect metals during a plasma-based IC manufacturing process according to one embodiment of the present disclosure. FIG. 2 illustrates internal multiple junctions within the transistor and the external interconnect metals connected to the multiple terminals outside the transistor. It also shows the interaction between inputs from the transistor, interconnects and plasma source during a plasma-based IC manufacturing process.

The junction leakage currents in the internal junctions of the transistor consider source-to-NW, drain-to-NW and NW-to-substrate junctions. Area- and periphery-intensive test structures are used to extract the parameters associated with these junction leakage currents.

The gate oxide leakage current takes into account both Fowler-Nordheim and direct tunneling mechanism. The parameters associated with the gate oxide leakage current can be extracted from experimental data of transistor gate oxides with a range of thickness. The demonstration to be given below of the present disclosure is based on the gate oxide parameters extracted from experimental data of the transistor gate oxide ranging from 25 to 80 Å in thickness.

The leakage current of the ILD layer between the adjacent interconnect metal layers may be determined based on the Frenkel Poole mechanism. The parameters associated with this ILD current may be extracted from the corresponding experimental data as well. For example, the plasma charging evaluator of the present disclosure may perform the simulation using the ILD current associated parameters extracted from the published experimental data.

Figure 3:
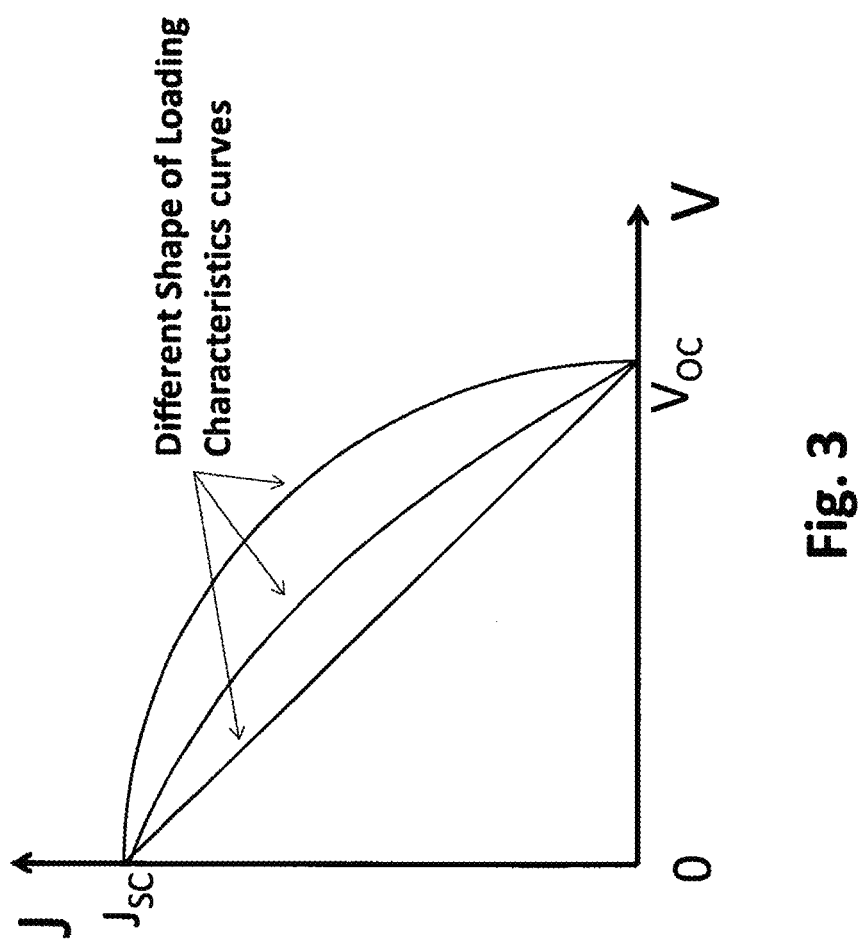
FIG. 3 shows an example of the plasma loading characteristics according to one embodiment of the present disclosure.

To estimate the effect of the plasma source during an IC back-end manufacturing process, one needs to know the loading characteristics associated with the plasma source. For manufacturing equipment associated with the plasma-based manufacturing process, the loading characteristics may be obtained when the equipment is turned on. The loading characteristics could be a function of the plasma conditions such as the plasma power, voltage and current, frequency. FIG. 3 shows an example of the plasma loading characteristics. $V_{OC}$ refers to the open-circuit voltage which is the maximum voltage that the surface of the wafer exposed to the plasma source can experience during the plasma process. $J_{SC}$ is the short-circuit current density which is the maximum plasma charging current density the plasma source can provide when there is no load to the plasma source. It is also the maximum current density that the wafer surface can receive from the plasma source. The plasma charging evaluator provides users with the options of a fixed $J_{SC}$ and $V_{OC}$ or a sweeping range of $J_{SC}$ and $V_{OC}$ during the simulation. The shape of the plasma loading characteristics curve, linear or non-linear as illustrated in FIG. 3, can also be controlled and adjusted at will by users employing the plasma charging evaluator in accordance with the present disclosure. Specifically, by manipulating one parameter associated with the shape of the plasma loading characteristics the plasma loading effect on the transistor over the course of the plasma charging may be fully appreciated.

Figure 4:
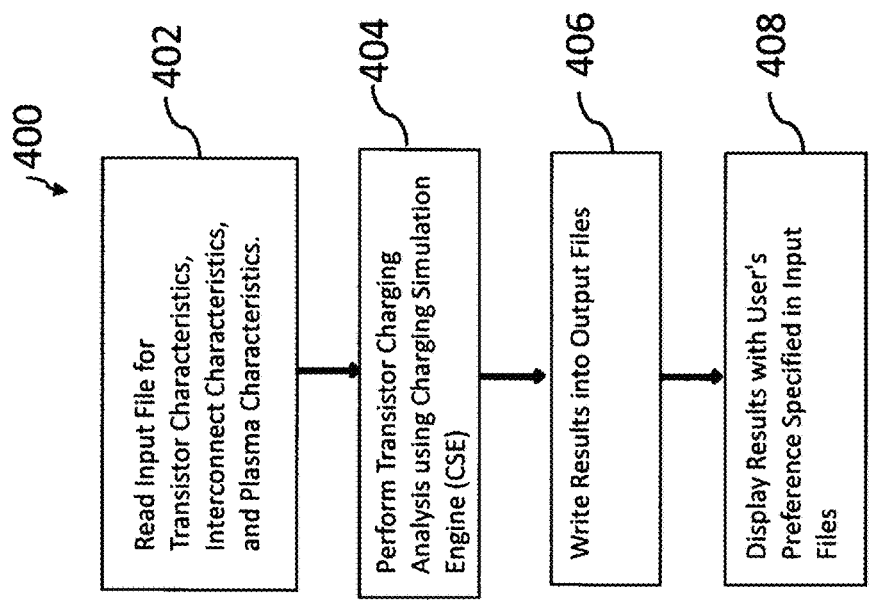
FIG. 4 is a simplified block diagram describing an operational flow of the plasma charging evaluator according to one embodiment of the present disclosure.

FIG. 4 is a simplified block diagram describing an operational flow 400 of the plasma charging evaluator according to one embodiment of the present disclosure. The plasma charging evaluator may be in the form of software running on a Linux or Unix-based computer. Once the user readies the input file by filling in the required input information associated with the transistor, interconnection and plasma process, the evaluator may perform the following steps described in FIG. 4. The evaluator may begin a corresponding evaluation task as soon as all the inputs including but limited to the three categories of them discussed in above are read in and processed by a pre-processor (step 402). The simulation and analysis may be performed by the charging simulation engine (CSE) 102 of FIG. 1 (step 404). A post-processor of the evaluator handles the task of outputting and displaying the results of the analysis (step 406). The input file also includes a section where the user can specify how the analysis results are to be presented (step 408).

Figure 5:
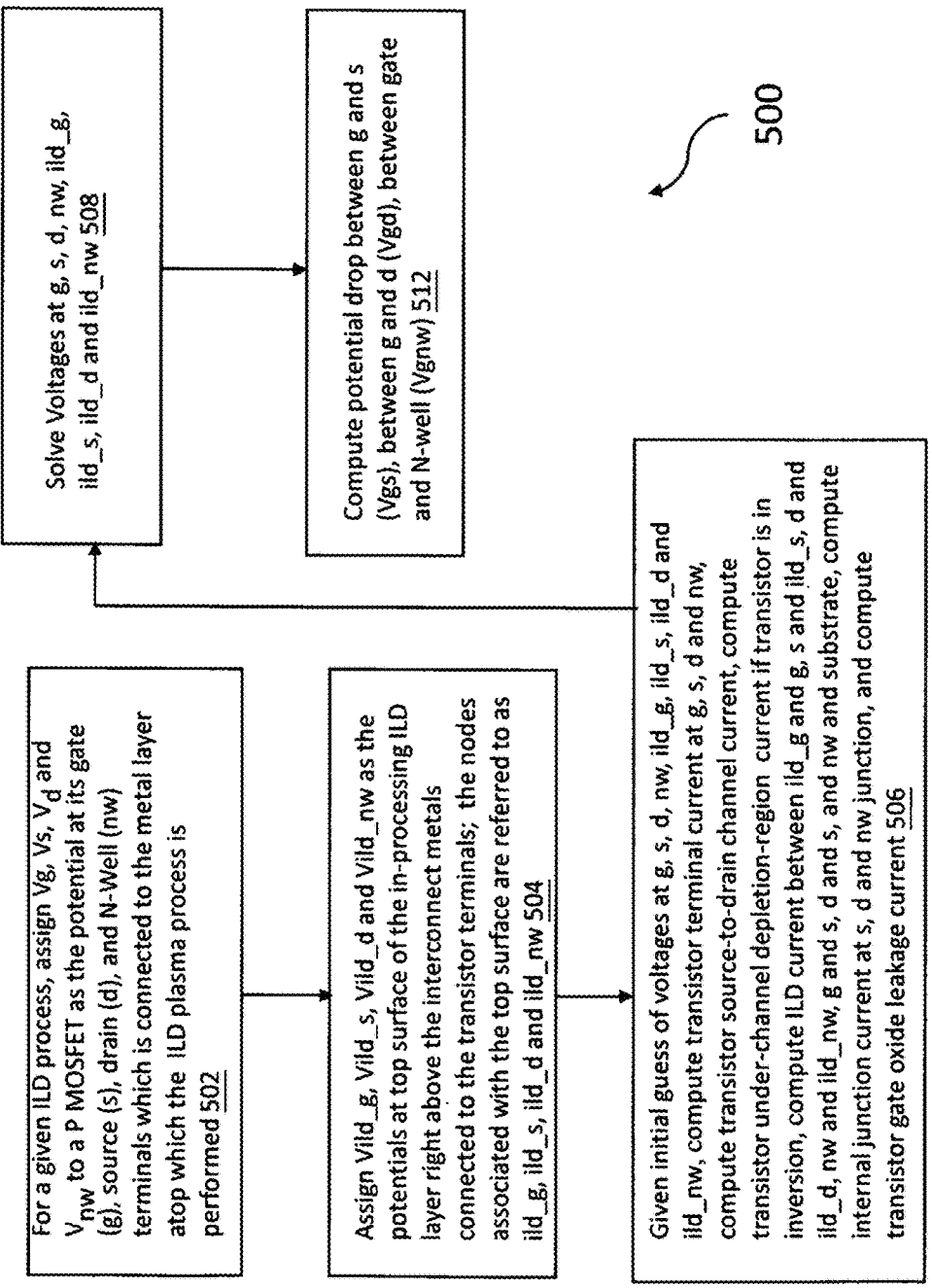
FIG. 5 is a simplified block diagram describing an operation of the plasma simulation engine according to one embodiment of the present disclosure.

FIG. 5 is a simplified block diagram explaining an operation 500 of the charging simulation engine (CSE) for a plasma-based ILD process according to one embodiment of the present disclosure. Note that the ILD process here could be either an ILD deposition process or an ILD etch-back process. A PMOS transistor is used here for the illustration purpose because it has one terminal (NW) more than its NMOS counterpart, and as a result, it has a more complicated transistor structure than a NMOS transistor, which naturally would mean that it may be associated with a more comprehensive physical effect in a plasma-based physical event. At the beginning of the simulation for the ILD process, the charging simulation engine may automatically assign voltages to the transistor's gate, source, drain and NW terminals and respective nodes associated with the top surface of the in-processing ILD layer right above the locations of the metal connecting to these transistor terminals (steps 502 and 504).

The transistor, plasma and interconnection-related inputs, in conjunction with an initial guess of the voltages at the transistor terminals and the nodes of the ILD top-surface, may enable the computation for the currents at ILD nodes and the transistor terminals, in the transistor source-to-drain channel and the under-channel depletion region if any, and in transistor gate oxide and the transistor internal source, drain and N-well to substrate junctions (step 506). Voltages at the respective transistor terminals and ILD nodes may be solved iteratively until their values converge (step 508). Potential drops across the gate oxide may then be computed, which could be represented as $V_{gs}$, $V_{gd}$, $V_{gc}$, and $V_{gnw}$ indicative of the potential drop in the transistor gate-to-source and gate-to-drain overlap region, transistor gate-to-channel gate-oxide region, and between the transistor gate and N-Well, respectively (step 512).

Note that the simulation of the plasma charging effect during the plasma involved ILD deposition or etch-back process described in the CSE operation flow of FIG. 5 can be performed from the beginning of the ILD process until the conclusion thereof. Nonetheless, the strongest plasma charging effect occurs when the thickness of the in-processing ILD film above the underlying metal is or near zero due to the ILD impedance effect. Thus, in practice, the simulation can be performed for the in-processing ILD film thickness from zero to 500 Å to capture the whole picture of the plasma charging effect. Such result would represent the case of growing ILD film thickness from 0 to 500 Å during the ILD deposition process, or the case of etching back ILD film thickness from 500 to 0 Å during the ILD etch-back process. For estimating the maximum plasma charging effect or any damage to the transistor gate oxide, it is sufficient to just perform one-point simulation with 0-Å in-processing ILD film in thickness. Note that in practical industrial ILD process, some thin base layers of material are grown first on the metal layer below in preparation for the ILD deposition. However, even with this thin base layer, the plasma charging effect to the underlying transistors is still nearly at its maximum. This is proved by the simulation results from the present disclosure, and will be demonstrated below.

Figure 6:
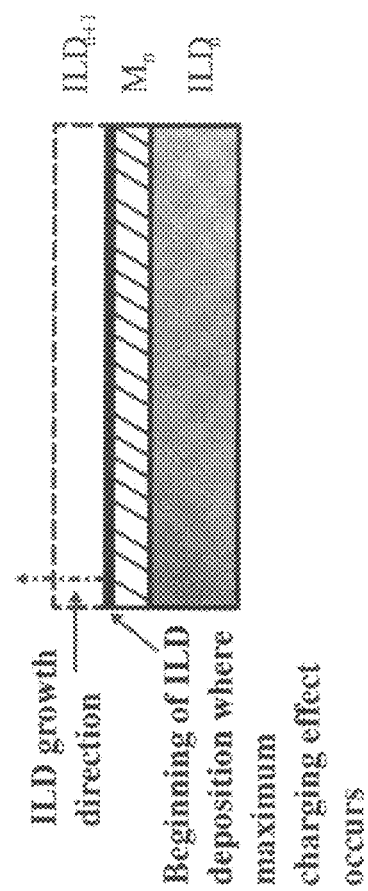
FIG. 6 illustrates a cross-sectional view of the ILD film growth corresponding to the maximum plasma charging effect according to one embodiment of the present disclosure.

Please refer to FIG. 6 illustrating ILD film growth corresponding to the maximum-charging-effect according to one embodiment of the present disclosure.

Figure 7:
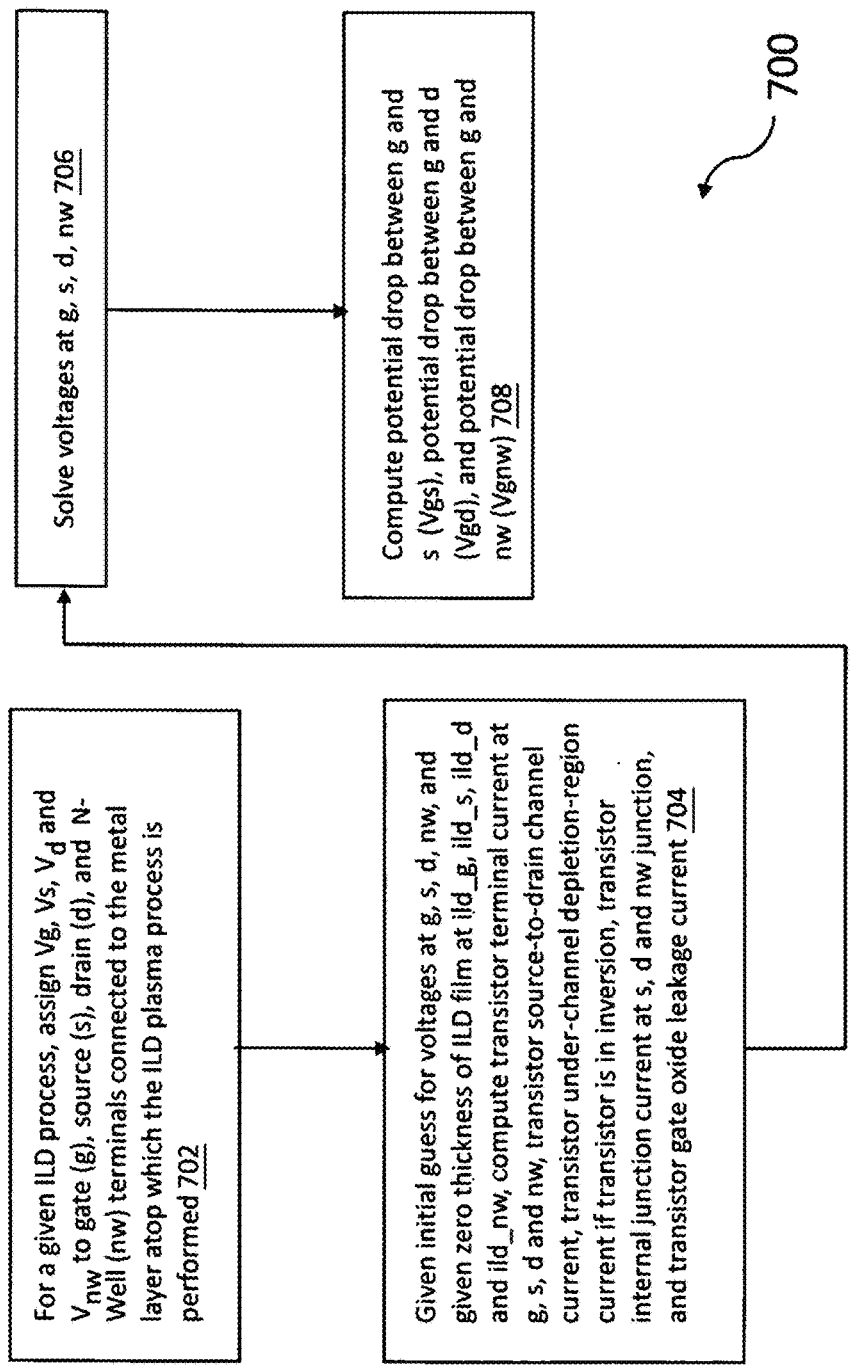
FIG. 7 is a simplified block diagram describing an operation of the plasma simulation engine in a one-point simulation for the maximum plasma charging effect according to one embodiment of the present disclosure.

That the maximum plasma charging effect occurs at the beginning of the ILD deposition process greatly simplifies the analysis for transistor reliability during the plasma-based IC manufacturing process. The disclosed plasma charging evaluator here offers an option for one-point maximum-charging-effect simulation. A CSE operational flow 700 associated with such one-point maximum-charging-effect simulation is described in FIG. 7.

The operational flow 700 may rely on the CSE to automatically assign voltages to the transistor's gate, source, drain and NW terminals connecting to the metal (step 702). It is worth noting that the operational flow 700 may not assign the voltages to the respective nodes at the ILD layer/film as the operational flow 400 may do, since the present embodiment is intended to show the occurrence of the maximum charging effect may correspond to the ILD layer/film being zero in thickness.

The transistor, plasma and interconnection-related inputs, in conjunction with an initial guess of the voltages at the transistor terminals, may enable the computation for the currents at the transistor terminals, in the transistor source-to-drain channel and the under-channel depletion region if any, and in transistor gate oxide and the transistor internal source, drain and N-Well to substrate junctions (step 704). Voltages at the respective transistor terminals may be solved iteratively until their values converge (step 706). Potential drops across the gate oxide may then be computed, which could be represented as $V_{GS}$, $V_{GD}$, $V_{GC}$, and $V_{GNW}$ indicative of the potential drop in the transistor gate-to-source and gate-to-drain overlap region, transistor gate-to-channel gate-oxide region, and between the transistor gate and N-Well, respectively (step 708).

The plasma charging performance of transistors may be associated with process and design parameters of the plasma source, the transistors and the interconnect metals connecting to the transistors. The disclosed plasma charging evaluator as previously mentioned may utilize at least these parameters as input in performing the corresponding simulations. FIG. 8(a) lists these parameters and their possible value ranges used in the plasma charging evaluator according to one embodiment of the present disclosure. Note that the disclosed plasma charging evaluator is capable of simulating any value range for these parameters. However, the values of these parameters must be physically feasible through characterization or calibration.

The plasma charging simulator of the present disclosure may simulate and output 2-D and 3-D results in the form of both graphs and texts. In P-MOSFET case, for 2-D results, there may be at least 5 primary inputs including the area of the interconnect metal connected at transistor gate ($A_g$), source ($A_s$), drain ($A_d$), N-Well ($A_{mw}$) terminals and ILD thickness ($t_{ILD}$). There may be at least 7 primary outputs including the voltage buildup at transistor gate ($V_g$), source ($V_s$), drain ($V_d$) and N-Well ($V_{nw}$), and the voltage drop between transistor gate and source ($V_{gs}$), gate and drain ($V_{gd}$) and gate and N-Well ($V_{gnw}$). These P-MOSFET 2-D input and output parameters are listed in FIG. 8(b) for the illustration purpose.

In the 3-D P-MOSFET case, there may be 10 possible inputs such as the pairs of ($A_g$, $A_s$), ($A_g$, $A_d$), ($A_g$, $A_{nw}$), ($A_s$, $A_d$), ($A_s$, $A_{nw}$), ($A_d$, $A_{nw}$), ($t_{ILD}$, $A_g$), ($t_{ILD}$, $A_s$), ($t_{ILD}$, $A_d$), ($t_{ILD}$, $A_{nw}$). There may be 7 outputs including but not limited to the voltage buildup at transistor gate ($V_g$), source ($V_s$), drain ($V_d$) and N-well ($V_{nw}$), and the voltage drop between transistor gate and source ($V_{gs}$), gate and drain ($V_{gd}$) and gate and N-well ($V_{gnw}$). These P-MOSFET 3-D input and output parameters are also listed in FIG. 8(b).

For N-MOSFET transistors, the number of the 2-D and 3-D primary simulation input and output parameters are less than that of P-MOSFET transistors due to absence of the N-Well terminal.

Note that for P-MOSFET case, when varying the area of the interconnect metals at the transistor terminals and maintaining all the remaining parameters associated with the plasma condition, the transistor process and design and others unchanged, one can arrive at the following conclusions: For 2-D simulations at any particular interconnect metal layer NM, 28 (=7×4, number of output parameters=7 and number of input parameters=4) X-Y graphs are generated. When NM=10, total of 280 X-Y graphs would be generated. Similarly, for 3-D simulations at any particular interconnect metal layer NM, 42 (=7×6, number of output parameters=7 and number of input parameter=6) X-Y-Z graphs are generated. When NM=10, total of 420 X-Y-Z graphs would be generated.

With various parameters listed in FIG. 8(a), the disclosed plasma charging evaluator may easily and quickly simulate and output results under conditions defined by different parameters which could be in hundred thousands, if not millions. The users of this evaluator can choose and simulate the effect associated with any of these conditions at will.

During the back-end plasma-based ILD process, ideally, a DC sheath may form between the plasma and the wafer with more positive potential toward the edge of the sheath close to the plasma due to much faster movement of the light-mass electrons to the wafer surface than the heavy ions. However, in reality, due to imbalance between the plasma near the transistor terminals and near the wafer substrate, positive ("+") or negative ("−") plasma potential may be present at the transistor terminals relative to the wafer substrate. Since the size of each of the individual transistors is so tiny, it is reasonable to assume that same polarity and same magnitude of the plasma potential may be present at the terminals of an individual transistor. The plasma seen by the wafer substrate may be located on the other side of the wafer or near the wafer edge where it usually forms the returning path for plasma-induced current flowing from the top surface of the wafer, where transistor terminals are located, through the wafer substrate. Therefore, the plasma seen in the two regions may be far apart. For example, one of the regions may be on the top wafer surface where the terminals of a particular transistor are located and the other region may be the wafer substrate at the wafer edge. As such, in the case of a large piece of wafer inside the chamber of the plasma-based processing equipment the plasma at the above-mentioned two regions may be quite different and imbalanced. The imbalance of the plasma at the transistor terminals and the wafer substrate at the wafer edge has been considered attributing to the transistor gate oxide degradation during the back-end IC manufacturing process.

For the illustration purpose, we define the case of "+" plasma potential seen by the transistor terminals on the top surface of the wafer as a "+" plasma event. "−" plasma potential may be seen by the transistor terminals in a "−" plasma event. For one N-MOSFET in the "+" plasma event, the potentials at the transistor gate, source and drain terminals are in positive values and the source and drain junctions are reverse-biased. The N-MOSFET may be in inversion or accumulation condition depending on the relative magnitude of the potential between the gate and the source/drain terminal.

In the "−" plasma event, the N-MOSFET may have the negative potential at its gate terminal and close to substrate potential at the source and drain terminals due to forward-biased source-to-substrate and drain-to-substrate junction. The transistors could therefore be in accumulation or weak inversion condition. The response to plasma may be more complicated in the P-MOSFET than in the N-MOSFET due to the existence of an extra N-Well (NW) layer in the P-MOSFET. For example, in the "+" plasma potential event, the P-MOSFET may not necessarily in the accumulation mode only. If the gate potential is lower than the source and drain potential which at the same time are also close to the NW potential, the P MOSFET could be driven into either the weak or strong inversion. Nonetheless, the exact operation mode of the transistor during the plasma charging event may be decided by the condition of the plasma, transistor external and internal configurations. A physics-based simulation tool such as the disclosed one may delineate such operation mode precisely by extracting exact values of the transistor terminal potentials based on the external and internal condition of the transistor.

For the P MOSFET in the "+" plasma event, the transistor gate, source, drain and NW terminals may have positive potentials. Their NW junctions are reverse biased and the source and drain junctions are forward-biased relative to the NW potential. The transistors may be in the accumulation or inversion condition depending on the relative magnitude of the potential between the gate and the source/drain terminal under this "+" plasma event. If the gate potential is less than the source and drain potential with Vg−Vs<Vt (negative threshold voltage value for a nominal P-MOSFET), the transistors may be driven into inversion condition. If the gate potential is greater than the source and drain potential with Vg−Vs>Vt, the transistors may be in the accumulation condition.

In the "−" plasma event, the P-MOSFET may either be in the inversion or accumulation condition and the potential at its gate, source, drain and NW terminals are in negative values. Their NW junctions are forward biased and shorted to the wafer substrate. Their source and drain junctions are reverse-biased.

The disclosed plasma charging evaluator is demonstrated with both N- and P-MOSFET. The simulation conditions are given as follows: devices under the simulation are N-MOSFET and P-MOSFET transistor of a 6-metal-layer CMOS process technology. Drawn channel width and length are 10 μm and 0.4 μm, respectively. The thickness of the gate oxide is 35 Å. The area of the source and drain region are 5.24 μm by 2.72 μm. The area of the NW region in the P-MOSFET transistor is 5.72 μm by 6.2 μm. Both the substrate doping and NW doping are $10^{14}$ cm$^{-3}$. The short-circuit current density ($J_{SC}$) and the open-circuit voltage ($V_{OC}$) of the plasma loading characteristics used in the simulation are $10^{-5}$ amp/cm$^2$ and 10V, respectively. A linear curve indicative of the plasma loading characteristics may be used in the simulation demonstration here.

The interconnect metals are connected at the transistor gate, source, drain and NW terminals at the top (i.e., the $6^{th}$ in this embodiment) metal layer. They are area-intensive and rectangular-shaped, and do not overlap each other. The area of these metals varies from 1 to 10,000 μm$^2$ during the simulation. The thickness of the ILD layers (from ILD-0 to ILD-6) is 5000 Å. The simulation temperature is at room temperature or 298 K.

Note that in the following, all terminal and between-terminal potentials in demonstration results shown in FIGS. 9(a) to 9(e) and FIGS. 10(a) to 10(h) are already converted to positive values from their original negative values under "−" plasma charging for the illustration purpose.

Figure 9A:
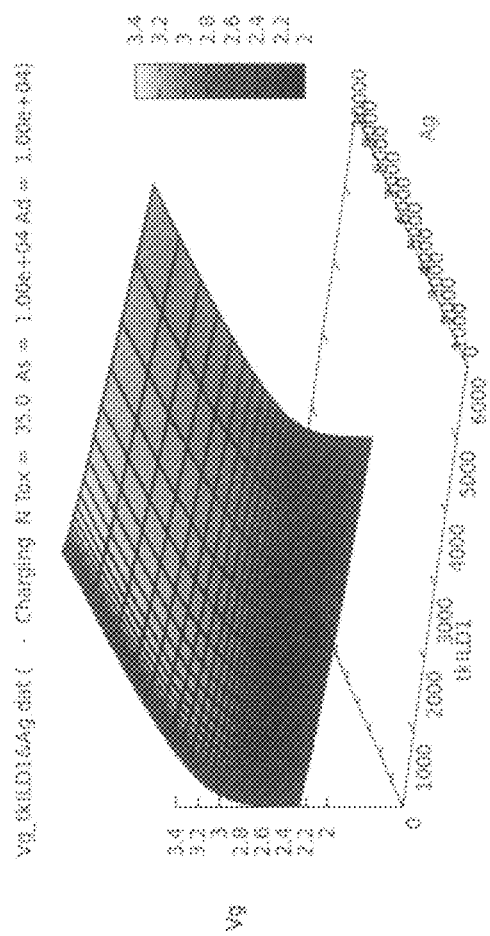
FIGS. 9($a$)-9($c$) are the simulated 3-D graphs of the disclosed plasma charging evaluator showing the effect of the thickness of ILD-1 film on terminal charging potential according to one embodiment of the present disclosure.
Figure 9B:
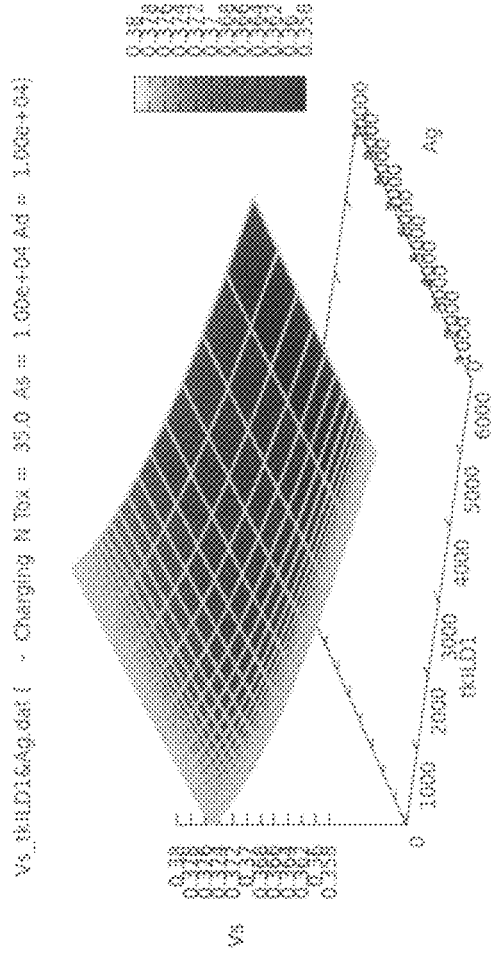
Figure 9C:
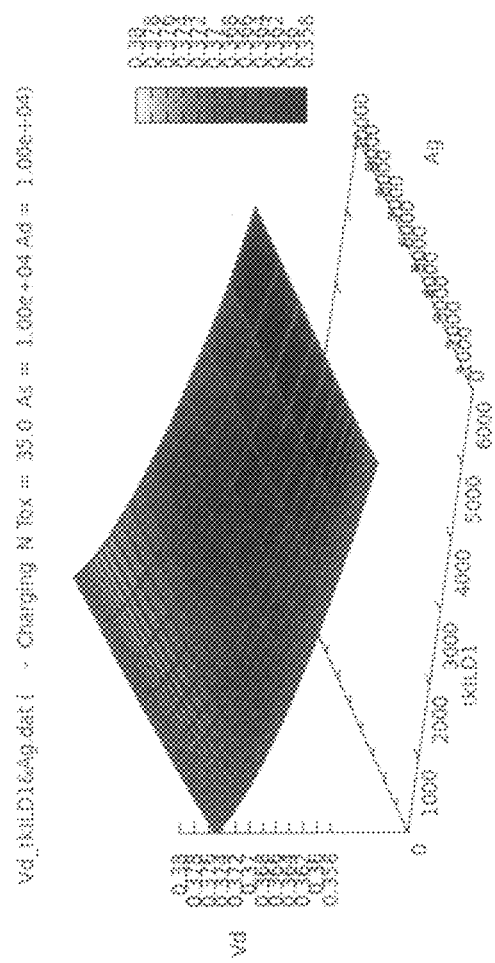

FIGS. 9(a) to 9(c) are the simulated 3D graphs from the disclosed plasma charging evaluator according to one embodiment of the present disclosure, demonstrating the thickness effect of the in-processing ILD-1 film (i.e., the ILD layer above the metal-1 layer as the lowest metal layer) on the terminal charging potential of the N-MOSFET transistor during a "−" plasma event. Metal-1 metals with area of 10,000 μm$^2$ are connected at source and drain terminals of the transistor. The Metal-1 metal area at the gate terminal may vary from 0 to 10000 μm$^2$ during the simulation. The transistor terminals are floating here with no protection device connected at transistors terminals.

FIG. 9(a) shows that as the ILD-1 film grows the charging potential at the gate terminal decreases faster when the transistor gate is connected to a large area of metal-1. The charging potentials at the source and drain terminals decrease but in a relatively slight fashion as the ILD-1 film grows regardless of whether the metal-1 area is at the transistor gate, as shown in FIGS. 9(b) and 9(c). Note that the charging potentials at the source and drain terminals shown in FIG. 9(b) and FIG. 9(c) may be identical, which may be due to the symmetrical structure of the MOSFET in terms the location of the source and drain. Also note that the Vg and Vs in FIGS. 9(a) and 9(b) suggests $-Vg-(-Vs) \ll Vt$, indicating that the N-MOSFET is driven into the strong accumulation condition during the "−" plasma charging event.

Figure 9D:
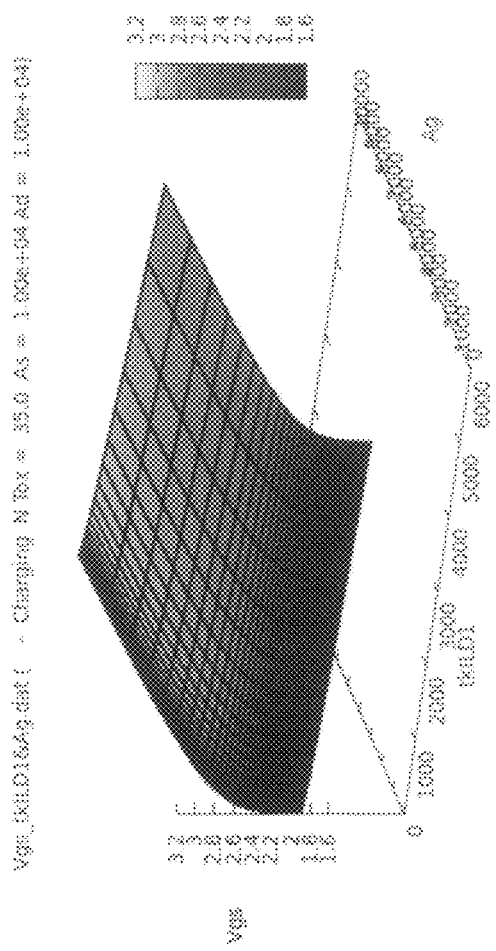
Figure 9E:
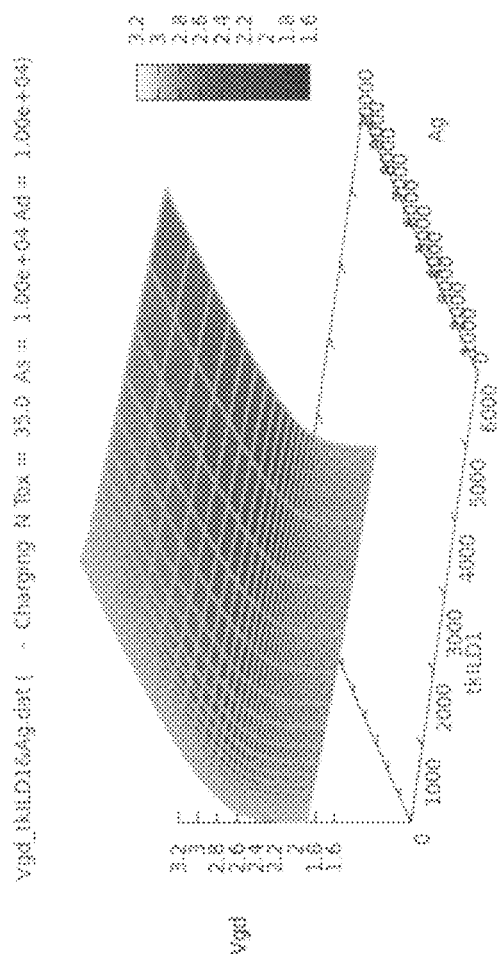

FIGS. 9(d) and 9(e) show the effect of the ILD-1 film thickness on the charging voltages across transistor gate oxide in the gate-to-source and gate-to-drain overlap region. Since the N-MOSFET transistor is in the strong accumulation condition, the potential at the surface of the strongly accumulated channel region which is near the gate oxide and silicon interface may be close to the substrate potential. Vg in FIG. 9(a) may represent the charging voltage buildup in the gate-to-channel oxide region. The charging voltage buildups in all three gate oxide regions may be similar. The identical Vgs and Vgd trends in FIGS. 9(d) and 9(e) may come from the identical Vs and Vd trends in FIGS. 9(b) and 9(c) due to the symmetrical nature of the source and drain region in the MOSFET. It is worth noting that at any given metal-1 area at the gate terminal the highest charging voltages in all three gate regions always occur at the ILD-1 layer being zero in thickness. Moreover, the maximum charging voltages may occur at the ILD-1 being zero in thickness and the metal-1 area at the gate terminal being largest. It is also worth noting that as the ILD-1 films grows the charging voltage in the three gate oxide regions may become smaller, reducing the likelihood of the gate oxide degradation.

Figure 10A:
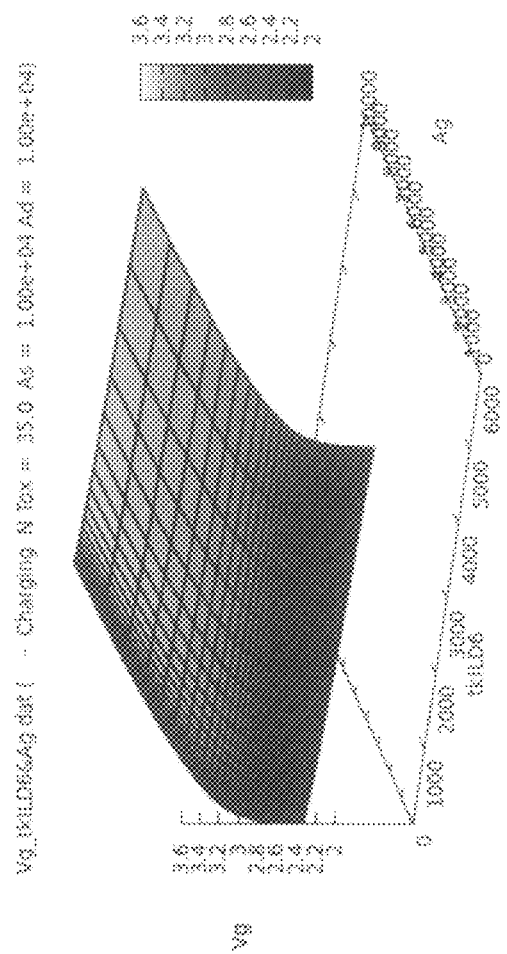
FIGS. 10($a$) to 10($c$) are the simulated 3D graphs demonstrating the thickness effect of the ILD-6 film on the terminal charging potential of the N-MOSFET transistor during a "−" plasma event according to one embodiment of the present disclosure.
Figure 10B:
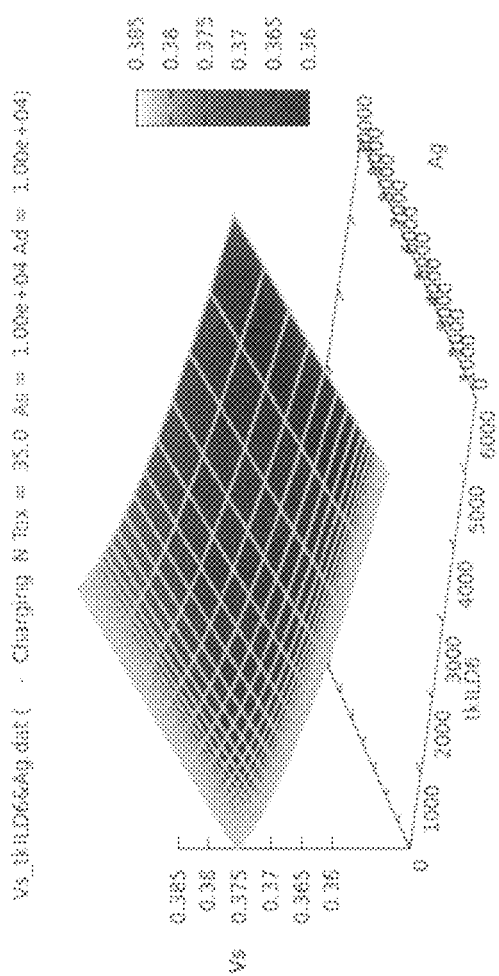
Figure 10C:
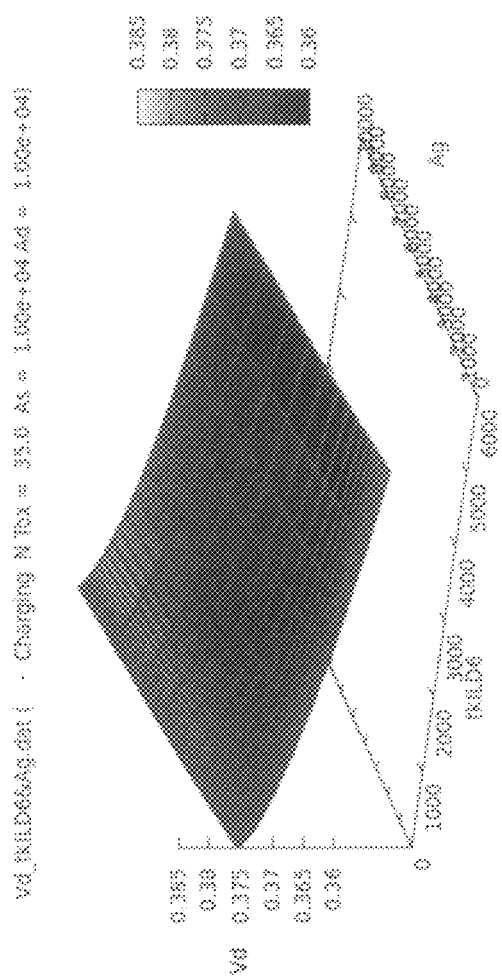
Figure 10D:
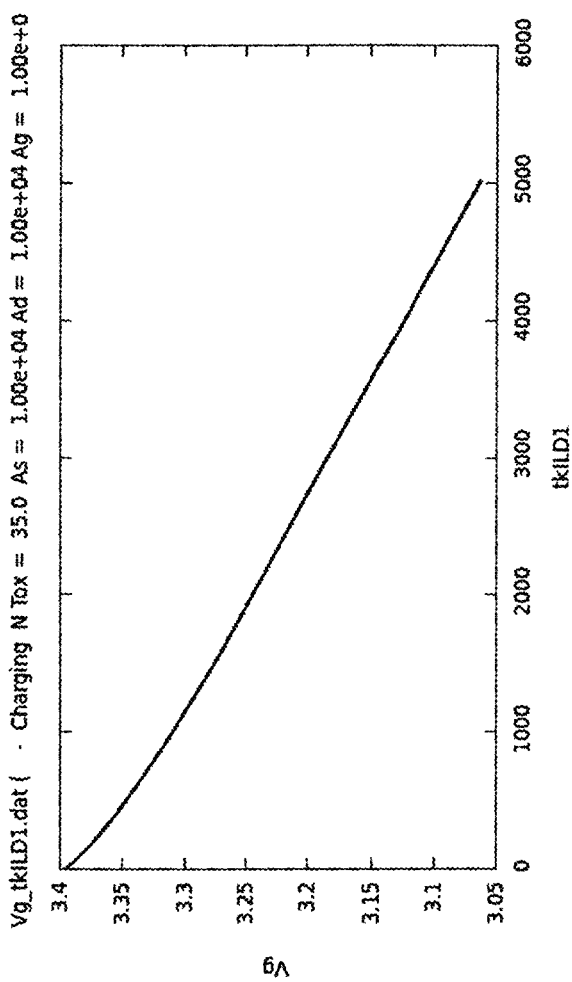
Figure 10E:
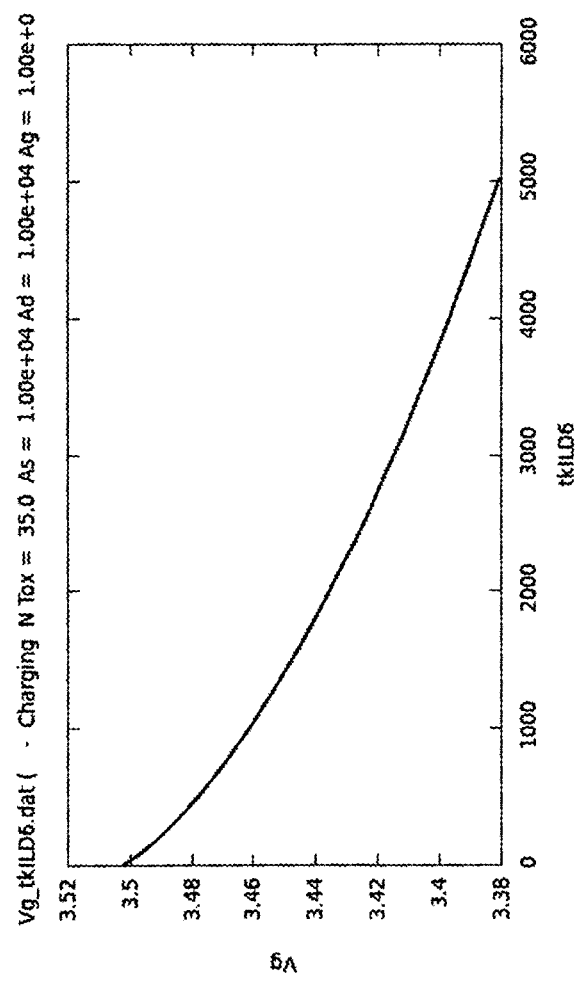

FIGS. 10(a) to 10(c) are the 3D graphs simulated by the plasma charging evaluator of the present disclosure, demonstrating the thickness effect of the in-processing ILD-6 film (i.e., the ILD layer above the metal-6 layer) on the terminal charging potential of the N-MOSFET transistor during a "−" plasma event. Metal-6 metals with area of 10,000 µm² may be connected at the source and drain terminals of the transistor. The metal-6 metal area at the gate terminal may vary from 0 to 10000 µm² during the simulation. The transistor terminals are floating with no protection device connected.

Comparing FIG. 9(a) with FIG. 10(a), one may notice that the high decreasing rate of the charging potential at the gate terminal with the large area of the metal connected at the gate terminal and the growth of the ILD film as observed in FIG. 9(a) appears to slow down in FIG. 10(a). This result indicates that the ILD film thickness effect becomes weaker as the back-end process moves toward higher-layer ILD films. This trend is more clearly seen in FIGS. 10(d) and 10(e), the 2D plots derived from FIGS. 9(a) and 10(a) at Ag=10000 µm².

Figure 10F:
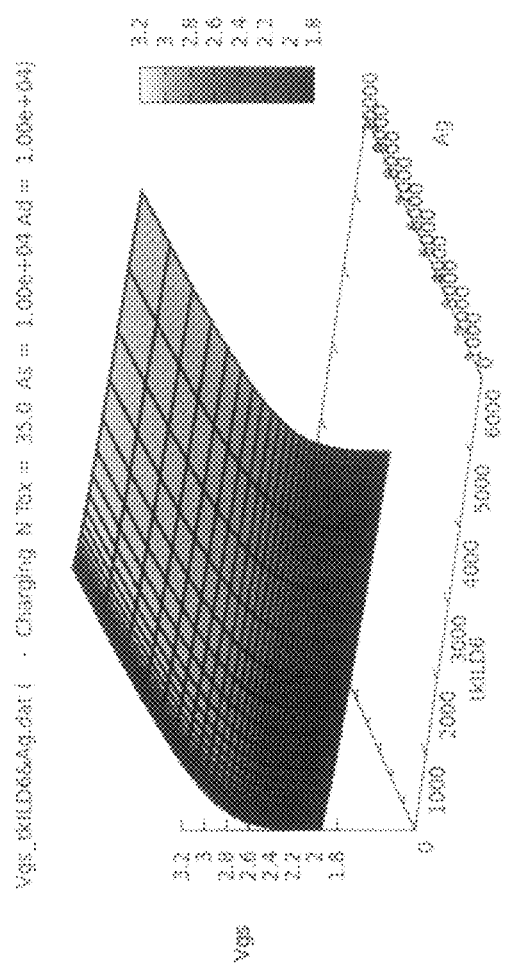
Figure 10G:
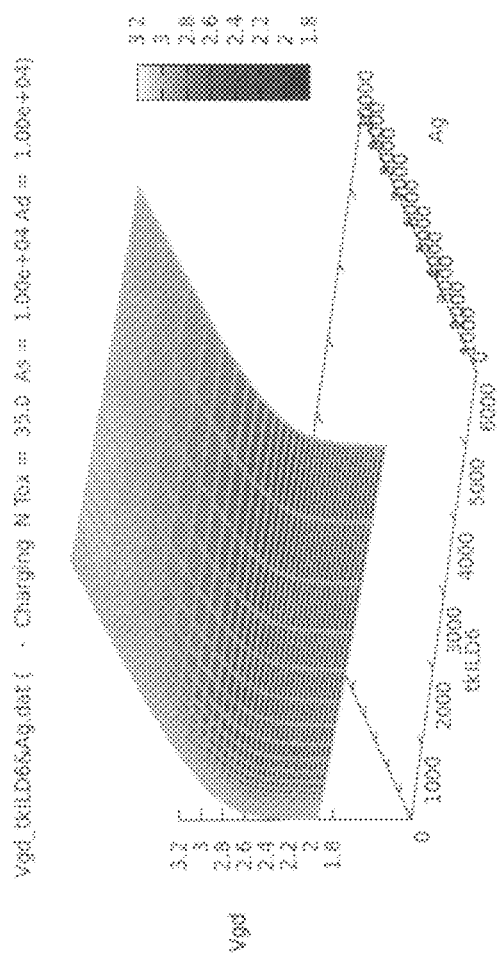

FIGS. 10(f) and 10(g) show the ILD-6 film thickness effect on the charging voltages across transistor gate oxide in the gate-to-source and gate-to-drain overlap region. Since the potential at the surface of the N-MOSFET transistor's strongly accumulated channel region, which is near the gate oxide and silicon interface, is close to the substrate potential during the "−" plasma event, Vg in FIG. 10(a) may represent the charging voltage buildup in the gate-to-channel oxide region. Viewing FIGS. 9(a), 9(d) and 9(e) and FIGS. 10(a), 10(f) and 10(g) together, one may conclude that the likelihood of the transistor gate oxide degradation may increase dramatically as the IC back-end manufacturing process moves to the higher-layer ILD films. The reason may be because the higher-layer ILD film process not only elevates the transistor gate-terminal charging potential, but also maintains such high gate-terminal charging potential during the entire period of the growth of the higher-layer ILD film/layer (such as ILD-6 film/layer). This is clearly shown in FIG. 10(a). The charging voltages in the three transistor gate oxide regions shown in FIGS. 10(a), 10(f) and 10(g) clearly point to the above conclusion where the electric field (i.e., the charging voltage/the gate oxide thickness) at the gate oxide is close to the 10 MV/cm, which is the threshold electric field for the gate oxide degradation.

Figure 10H:
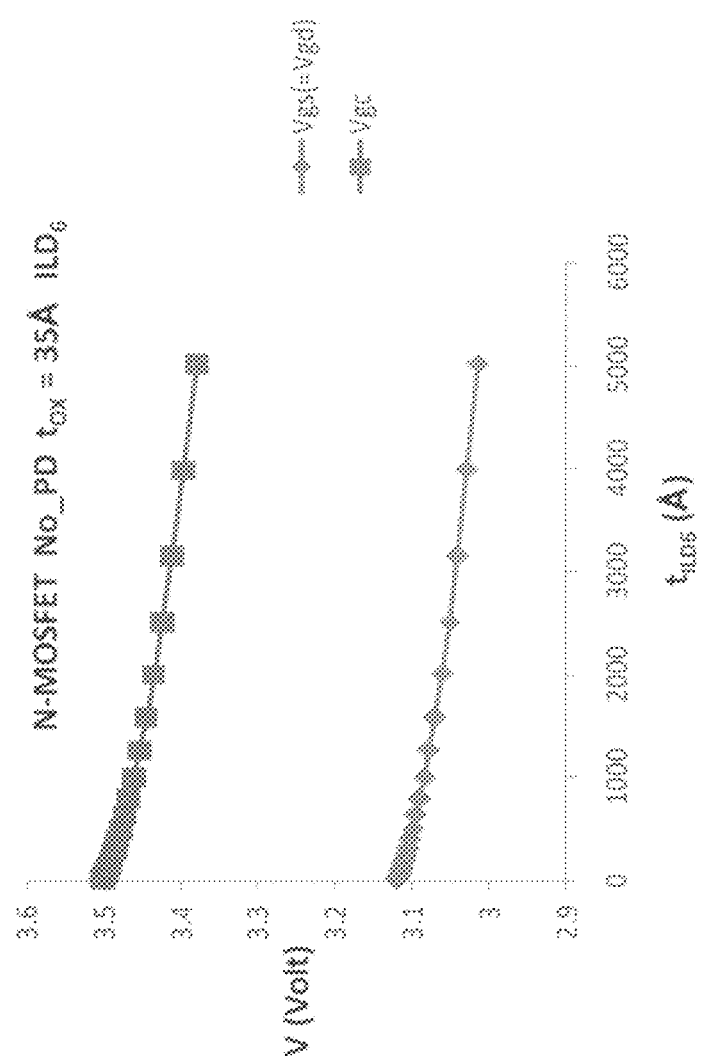

FIG. 10(h) summarizes the effect of the ILD-6 film thickness under the simulation condition of the N-MOSFET mentioned above. The maximum Vgs and Vgnw occur at the beginning of the ILD-6 deposition.

Vgs and Vgnw may remain steadily high at a few hundred Angstroms of the ILD thickness shortly after the start of the ILD film growth. This confirms that the MOSFET gate oxide may just experience the maximum stress at the beginning of each of the ILD growth processes even when there already exists a few hundred Angstroms of the base layer formed in preparation for the ILD film growth.

In the above, the disclosed charging evaluator may have demonstrated its capability of representing the plasma charging behavior of the N-MOSFET transistor during the ILD film growth in terms of a function of both the area of the metal connected to the gate terminal and the thickness of the ILD film. The disclosed plasma charging evaluator in fact may be capable of simulating such effect in terms of the area of the metals connected to all transistor terminals. However, for the illustration purpose, only the effect of the metal area at the gate terminal is demonstrated here.

Since the maximum charging potentials at the transistor terminals may represent the worst-case scenario during the plasma charging events, we now focus on the demonstration of this plasma charging evaluator under the condition of zero ILD thickness, which may be associated with the maximum transistor terminal charging potentials and the maximum charging voltages across the transistor gate oxide in the gate-to-source and gate-to-drain overlap region and in the gate-to-channel region. Zero ILD thickness represents the beginning of the ILD deposition process when the gate terminal may experience maximum plasma induced (coupling-down) potential.

FIGS. 11(a) to (e) show the simulated 3-D plots of the transistor terminal charging potential and the charging voltages across transistor gate oxide in the gate-to-source and gate-to-drain overlap region and in the gate-to-channel region versus the area of metal connected at the drain and source terminals when ILD-6 layer is zero in thickness in a N-MOSFET during a "−" plasma event according to one embodiment of the present disclosure. Metal-6 metal with area of 10,000 µm² may be connected at the gate terminal of the transistor. The three transistor terminals are floating.

Note that the terminal and between-terminal potentials shown in FIGS. 11 and 12 below are in original negative values under the "−" plasma charging. They are not converted to positive values as those shown in FIGS. 9 and 10.

Clearly, during the "−" plasma charging event, all terminal charging potentials may increase as the area of the metal-6 at the transistor source and drain terminals increases. Such trend may be slowed as the area of the metal-6 at the transistor source and drain terminals increases further. During the "−" charging event, the source and drain junction of the P-MOSFET is slightly forward-biased, as evidenced by the Vs and Vd charging potential in FIGS.

Figure 11A:
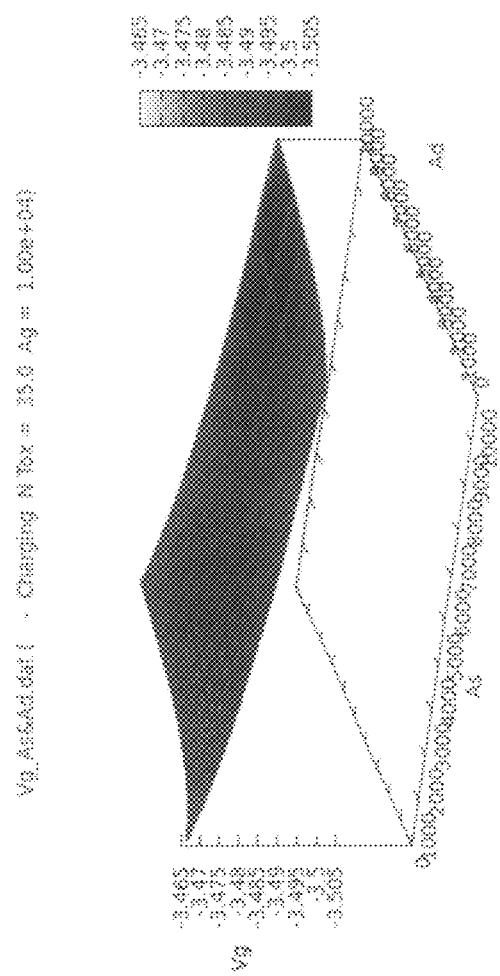
FIGS. 11($a$) to ($e$) show the simulated 3-D plots of the transistor terminal charging potential and the charging voltages across transistor gate oxide in the gate-to-source and gate-to-drain overlap regions and in the gate-to-channel region versus the area of metal connected at the drain and source terminals when ILD-6 layer is zero in thickness in a N-MOSFET during a "−" plasma event according to one embodiment of the present disclosure.
Figure 11B:
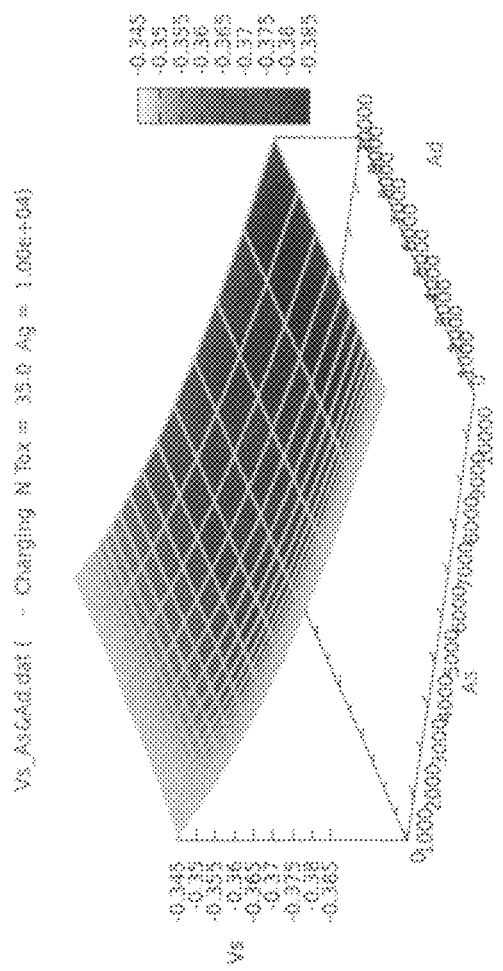
Figure 11C:
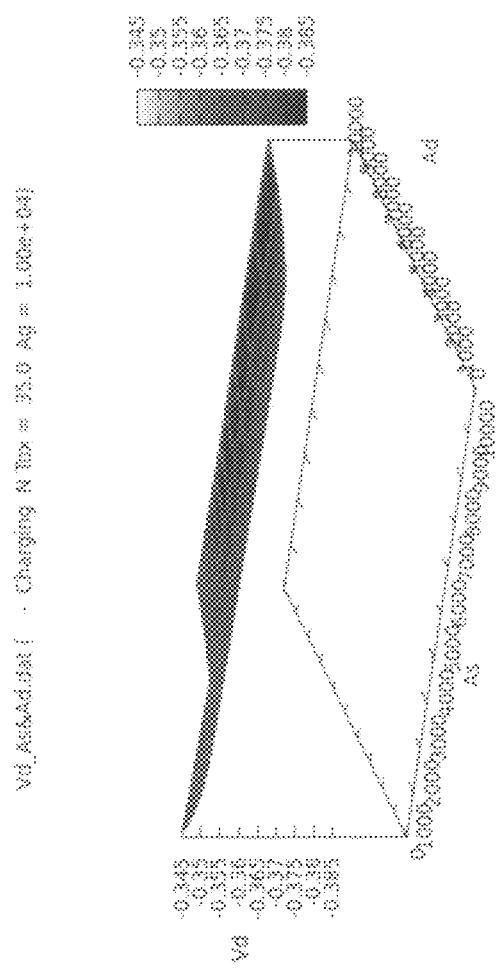
Figure 11D:
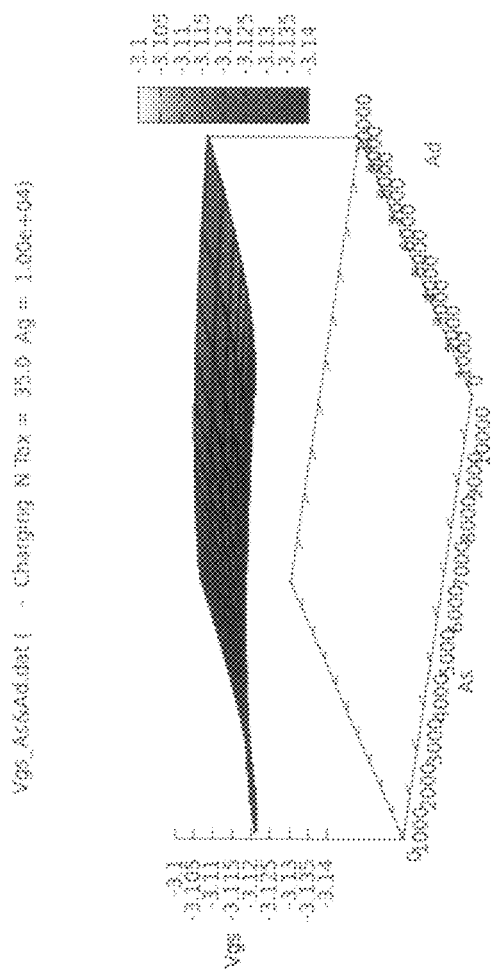
Figure 11E:
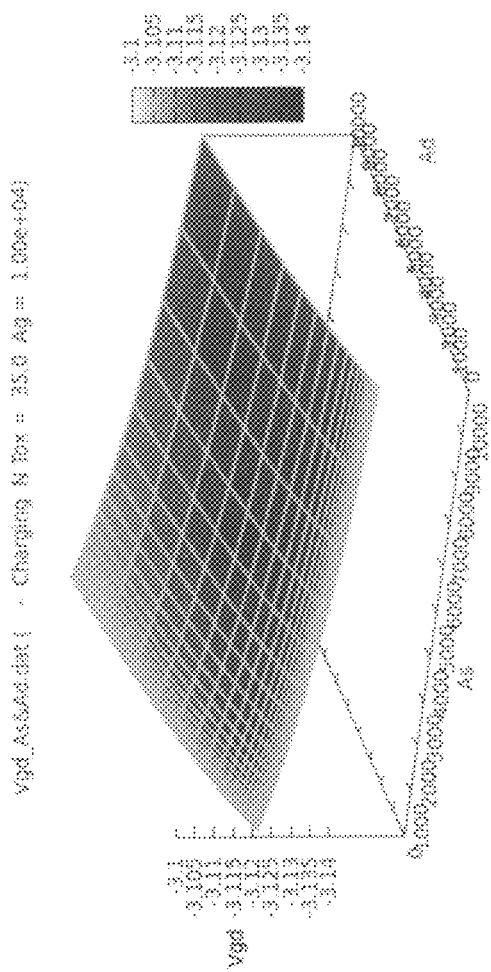

11(b) and 11(c). The source and drain antenna effect or the charging current absorbed at the source and drain terminals mostly contributes to the large forward-biased source and drain junction currents. Consequently, the source and drain charging potentials are pinned down to small values in order to sustain a high source and drain terminal charging currents (i.e., the source and drain terminal charging current-voltage load line meets the plasma loading characteristics curve at a higher current which corresponds to a lower voltage.) Therefore, the metal-6 area at the source and drain terminals may only have small effect on the terminal charging potential. The same effect is also observed on the charging voltages in the three transistor gate oxide regions shown in FIGS. 11(d) and 11(e) due to nearly non-change charging potential at the gate terminal as shown in FIG. 11(a).

Nonetheless, the large metal-6 area of 10000 µm² at the gate terminal may correspond to the charging potential as high as −3.5V at the gate terminal. The charging potentials at the source and drain terminals may be around −0.4V. As such, the charging voltages of Vgs (Vgd) and Vgc (i.e., the charging voltage buildup in the gate-to-channel oxide region) may be around 3V and −3.5V, respectively. This indicates that the transistor gate oxide in the gate-to-channel region is likely to experience the degradation during the "−" plasma event as the electric field in the gate oxide there is around 3.5V/35 Å=10 MV/cm.

Figure 12A:
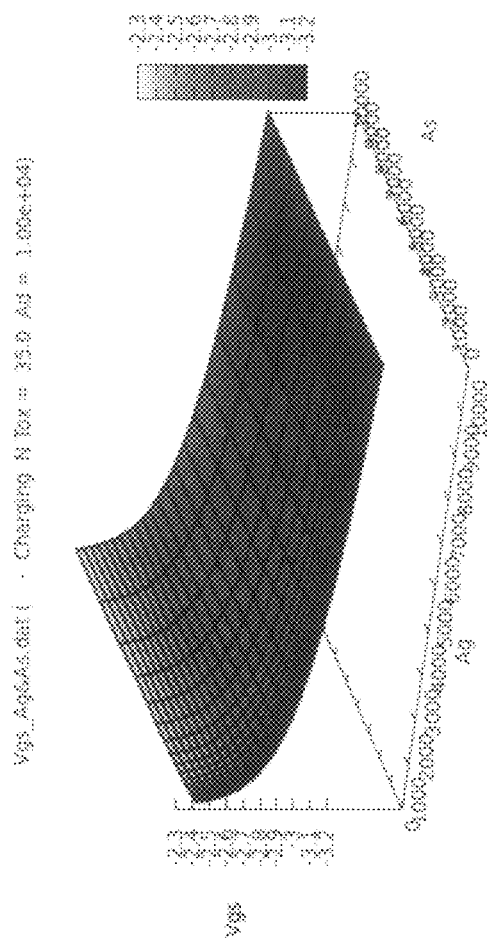
FIGS. 12($a$) and 12($b$) show the simulated 3-D plots of the transistor terminal charging potential and the charging voltages across transistor gate oxide in the gate-to-source overlap region (Vgs) and in the gate-to-channel region (Vgc) versus the area of the metal connected at the gate and source terminals when the ILD-6 layer is zero in thickness in a N-MOSFET during a "−" plasma event according to one embodiment of the present disclosure.
Figure 12B:
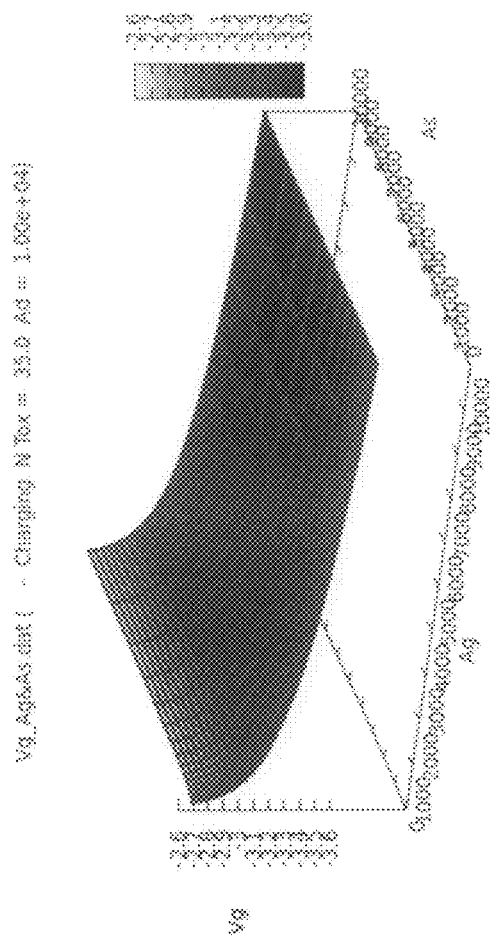

FIGS. 12(a) and 12(b) show the simulated 3-D plots of the transistor terminal charging potential and the charging voltages across transistor gate oxide in the gate-to-source overlap region (Vgs) and in the gate-to-channel region (Vgc) versus the area of the metal connected at the gate and source terminals when the ILD-6 layer is zero in thickness in a N-MOSFET during a "−" plasma event according to one embodiment of the present disclosure. The metal-6 metal with the area of 10,000 µm² may be connected at the drain terminal of the transistor. The three transistor terminals are floating. Here only Vgs trend is shown since Vgd trend is the same as Vgs trend. The data here indicates that the gate oxide above the channel region (i.e., in the gate-to-channel region) may not be subject to any degradation until the area of the metal-6 at the gate terminal reaches about 3000 µm². Here, it could be inferred that the metal-6 metal at the source (or drain) terminal has virtually no effect on Vgs (Vgd) trend.

The next demonstration are the evaluation for transistor charging behaviors when the transistor is protected by a device at its gate, a practice used in industry to protect the transistors in circuits against plasma induced charging during the IC back-end manufacturing process.

FIGS. 13(a) to 13(e) show the simulated transistor terminal charging potentials and the charging voltages across transistor gate oxide in the gate-to-source (Vgs) and gate-to-drain (Vgd) overlap region versus the area of the metal connected at the source and drain terminals when the ILD-6 film is zero in thickness in a P-MOSFET during a "−" plasma event according to one embodiment of the present disclosure. The metal-6 metal with the area of 10,000 µm² may be connected at the gate and NW terminals of the transistor. An n+p diode of 1 µm² may be connected at the transistor gate.

Figure 13A:
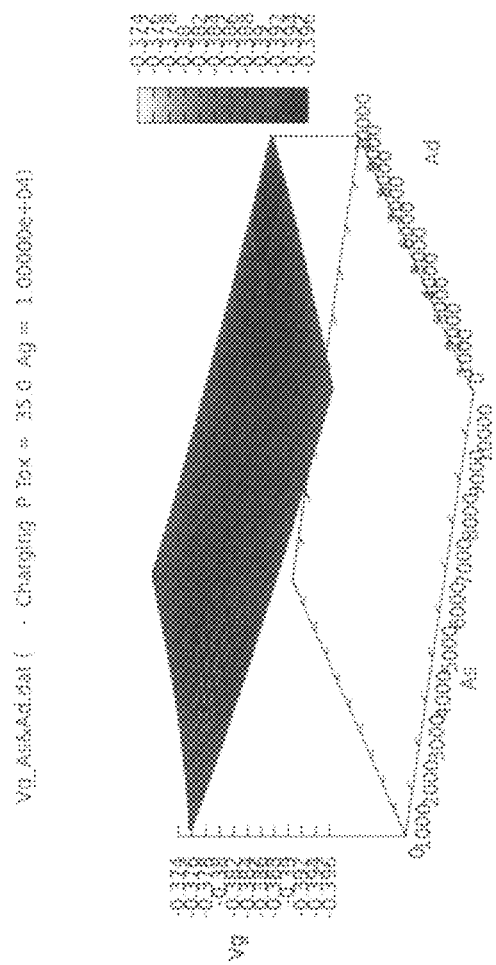
FIGS. 13($a$) to 13($e$) show the simulated transistor terminal charging potentials and the charging voltages across transistor gate oxide in the gate-to-source (Vgs) and gate-to-drain (Vgd) overlap region versus the area of the metal connected at the source and drain terminals when the ILD-6 film is zero in thickness in a P-MOSFET during a "−" plasma event according to one embodiment of the present disclosure.
Figure 13B:
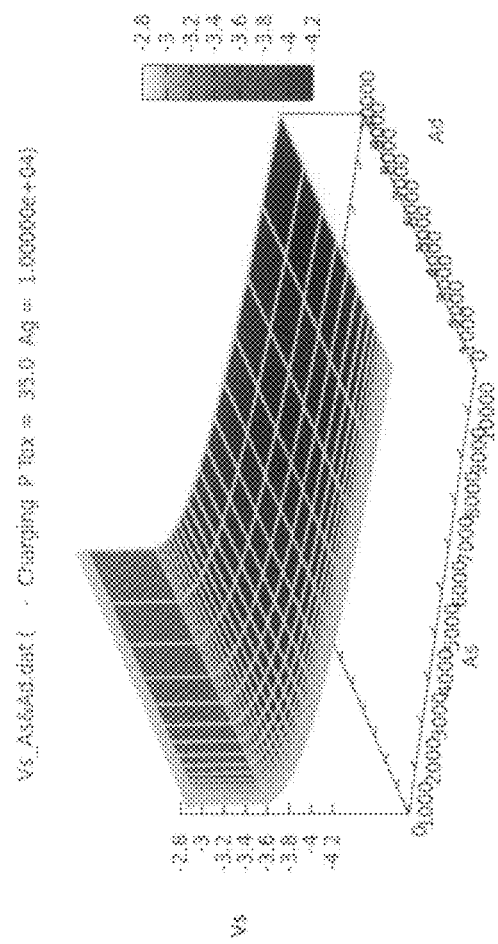
Figure 13C:
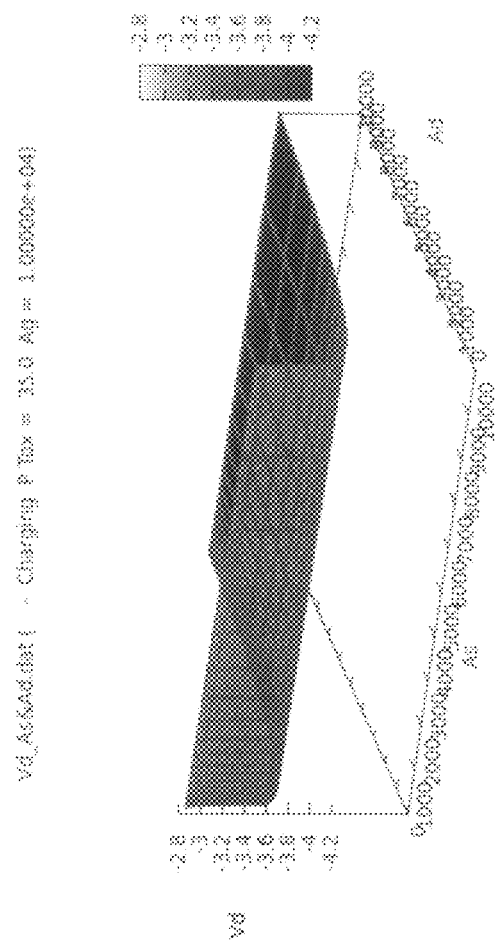
Figure 13D:
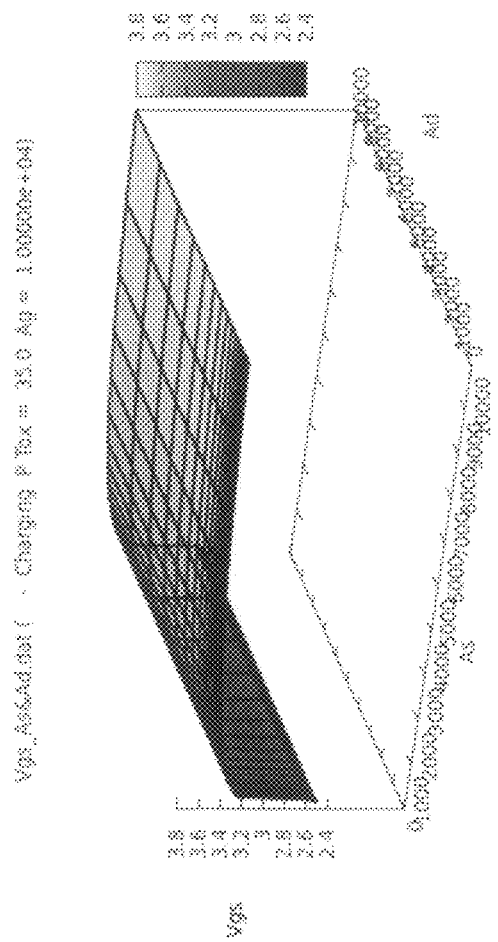
Figure 13E:
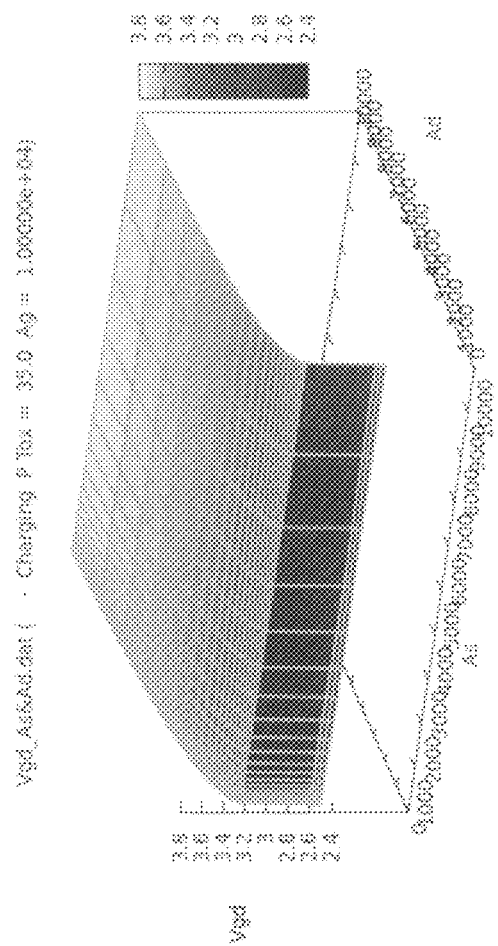

The simulated Vg and Vs in FIGS. 13(a) and 13(b) collectively suggests Vg−Vs>>Vt, indicating that the P-MOSFET is driven into the deep accumulation condition during the "−" charging event when a protection n+p diode is attached at the transistor gate. The NW-to-substrate junction may be forward-biased during the "−" charging event, minimizing the effect of the metal-6 area at the NW terminal. The gate charging potential is effectively pinned down by the protection diode to around −0.37 to −0.39V. The source-to-NW and drain-to-NW junctions may be strongly reversed biased even with little metal at the source and drain terminals. The source-terminal charging potential may depend on the area of the metal-6 at the source terminal, and may rise dramatically when the metal-6 area is around 1000 µm². The drain charging potential shows similar trend versus the area of the metal-6 at the drain terminal. Such trend may consequently carry over to the charging voltage across the transistor gate oxide in the gate-to-source (Vgs) and gate-to-drain (Vgd) overlap regions.

Figure 14A:
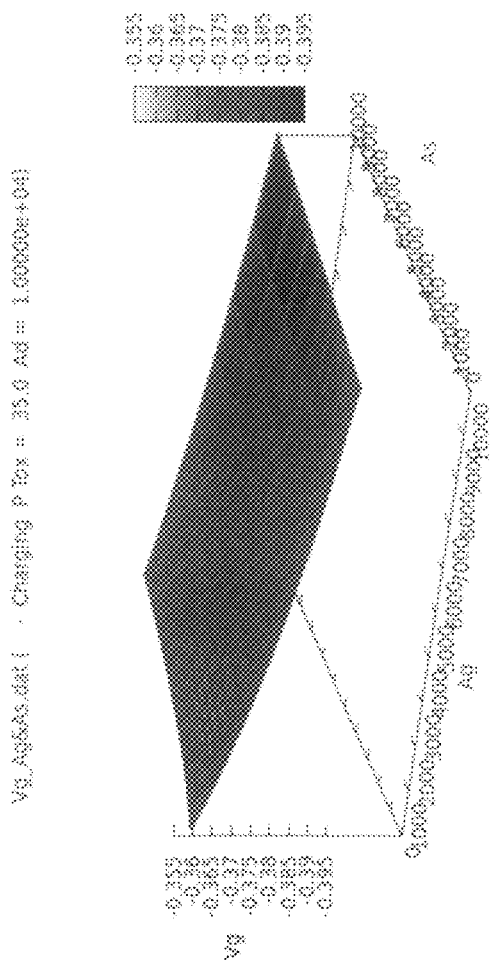
FIGS. 14($a$) to 14($c$) show the simulated transistor terminal charging potentials (Vg and Vs) and the charging voltages across the transistor gate oxide in the gate-to-source (Vgs) versus the area of the metal connected at the gate and source terminals when the ILD-6 is zero in thickness in a P MOSFET during a "−" plasma event according to one embodiment of the present disclosure.
Figure 14C:
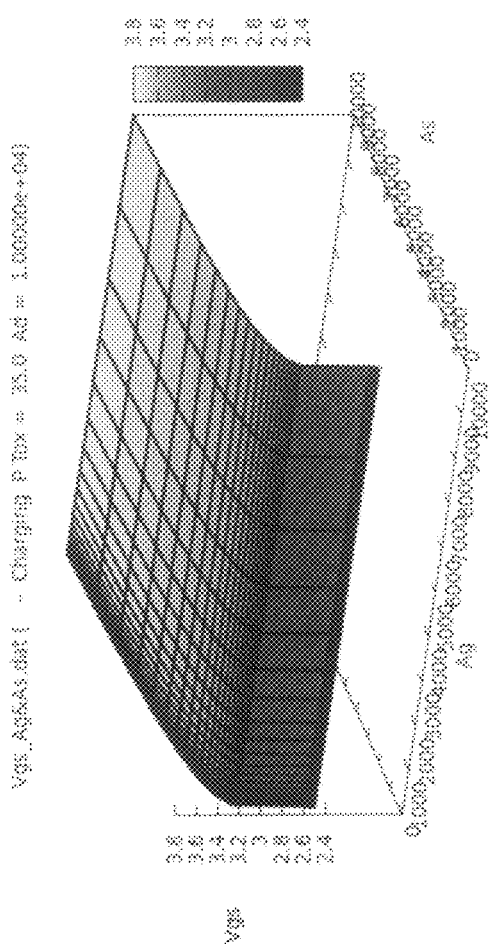

FIGS. 14(a) to 14(c) show the simulated transistor terminal charging potentials (Vg and Vs) and the charging voltages across the transistor gate oxide in the gate-to-source (Vgs) versus the area of the metal connected at the gate and source terminals when the ILD-6 is zero in thickness in a P MOSFET during a "−" plasma event according to one embodiment of the present disclosure. The metal-6 metal with the area of 10,000 µm² may be connected at the drain and NW terminals of the transistor. A n+p diode of 1 µm² may be connected at the gate terminal. The relationship between Vd and Vgd is not shown here since it is similar to the relationship between Vs and Vgs. The data show that all terminal charging potentials are shown to be insensitive to the area of the metal-6 at the gate terminal. This is due to the fact that the absorbed charging current at the gate terminal is nearly all drained by the forward-biased protection diode during the "−" plasma charging event.

FIGS. 13 and 14 suggest that the likelihood of the gate oxide degradation in the gate-to-source and gate-to-drain overlap region may dramatically increase as the area of the metal-6 at the source or drain terminal increases over 1000 µm² where the charging voltages across the transistor gate oxide jump to 3.8V when the P-MOSFET is protected by a protection diode during a "−" plasma charging event. However, there should be no oxide degradation occurring in the gate-to-channel region as the voltage across the region is approximately close to the gate charging potential of less than −0.4V.

The above simulation results may suggest that a transistor may not be protected by a charging protected device during a plasma charging event such as in the case here of a P-MOSFET exposed to a "−" plasma charging event. The example here demonstrates that the disclosed plasma charging evaluator may provide details to guide users to understand the charging behaviors at the transistor terminals during the plasma charging events and also shed light on better charging protection strategy for the transistors.

To evaluate the effect of the transistor gate oxide thickness on the charging voltages across the transistor gate oxide in the gate-to-source and gate-to-channel overlap region, please see the follows. The effect to the gate-to-drain overlap region may be the same as the gate-to-source overlap region due to the symmetrical nature of the two regions. The condition of simulation here may be the same as that in the simulation reflected in FIGS. 11 and 12 with a N-MOSFET transistor exposed to a "−" plasma event with ILD-6 film being zero in thickness and all transistor terminals floating.

FIGS. 15(a) to 15(d) show the simulated 3-D plots of the charging voltages across the transistor gate oxide in the gate-to-source overlap region (Vgs) versus the area of the metal-6 metal at the source and drain terminals with the gate oxide thickness at 25 Å, 35 Å, 50 Å and 80 Å, respectively. The maximum Vgs are −1.21, −3.12, −5.09 and −7.18V corresponding to the electric fields of −4.8, −8.9, −10 and −9.0 MV/cm, respectively. The result here may indicate that the gate oxide in the gate-to-source overlap region of the P-MOSFET is more susceptible to the degradation in the case of the thicker gate oxide such as when the thickness of the gate oxide approaches 50 Å. This result also explains that the transistors with thinner gate oxide thickness have been experiencing less plasma charging damage during recently developed process technologies.

FIGS. 15(e) to 15(h) show the simulated 3-D plots of the charging voltages across the transistor gate oxide in the gate-to-channel overlap region (Vgc) versus the area of the metal-6 metal at the source and drain terminals with the gate oxide thickness at 25 Å, 35 Å, 50 Å, and 80 Å, respectively. The observed maximum Vgc may be −1.6, −3.5, −5.5 and −7.6V corresponding to the electric fields of −6.4, −10, −11 and −9.5 MV/cm, respectively.

The above result may indicate that the gate oxide in the gate-to-channel overlap region of the P-MOSFET is susceptible to the degradation at the gate oxide thickness around 30 to 50 Å. Both the Vgs and Vgc results here may suggest that the transistors with its gate oxide in certain thickness have been experiencing less plasma charging damage. The fact that the most severe degradation of the transistor gate oxide in the industry has been at the gate oxide thickness ranging from 40 to 60 Å may coincide well with the present disclosure.

Figure 15A:
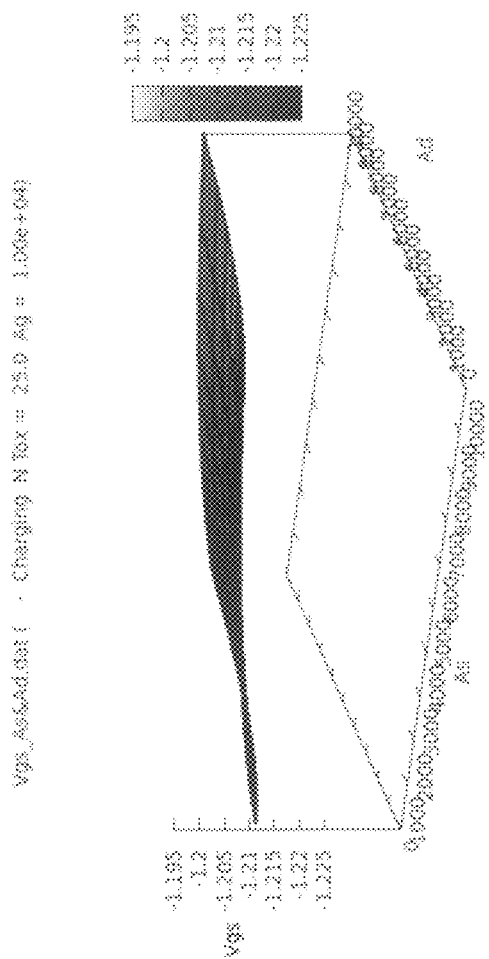
FIGS. 15($a$) to 15($d$) show the simulated 3-D plots of the charging voltages across the transistor gate oxide in the gate-to-source overlap region (Vgs) versus the area of the metal-6 metal at the source and drain terminals with the gate oxide thickness at 25 Å, 35 Å, 50 Å and 80 Å, respectively.
Figure 15B:
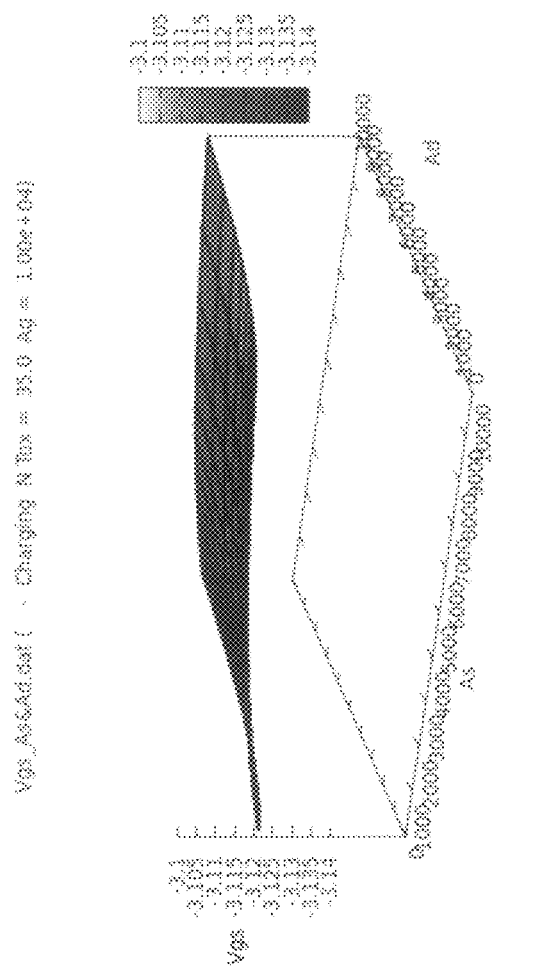
Figure 15C:
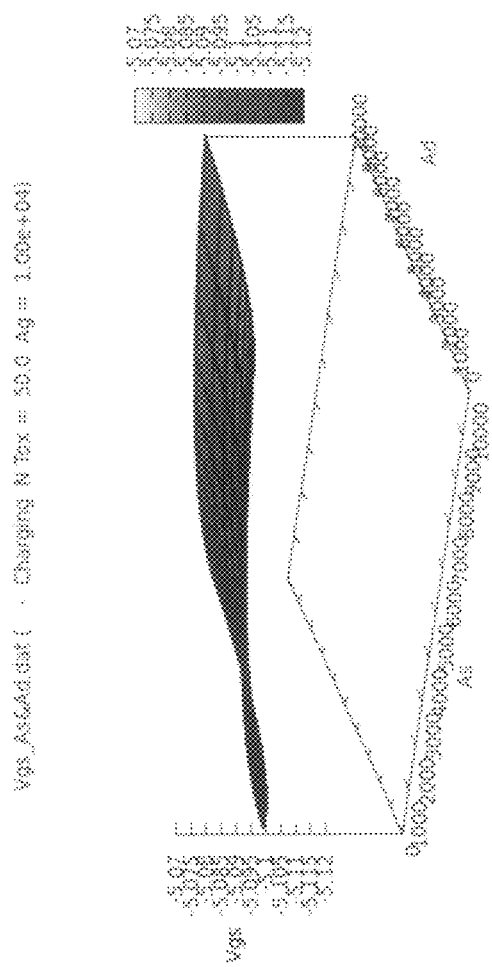
Figure 15D:
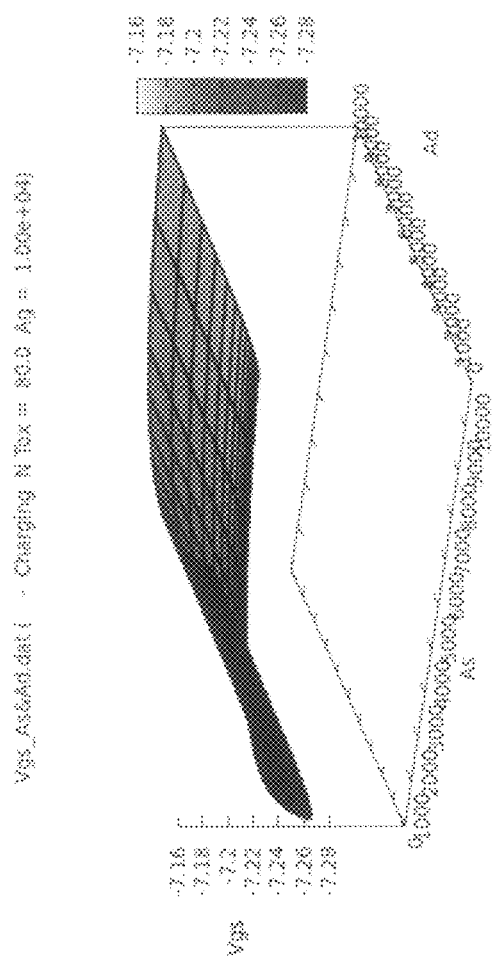
Figure 15E:
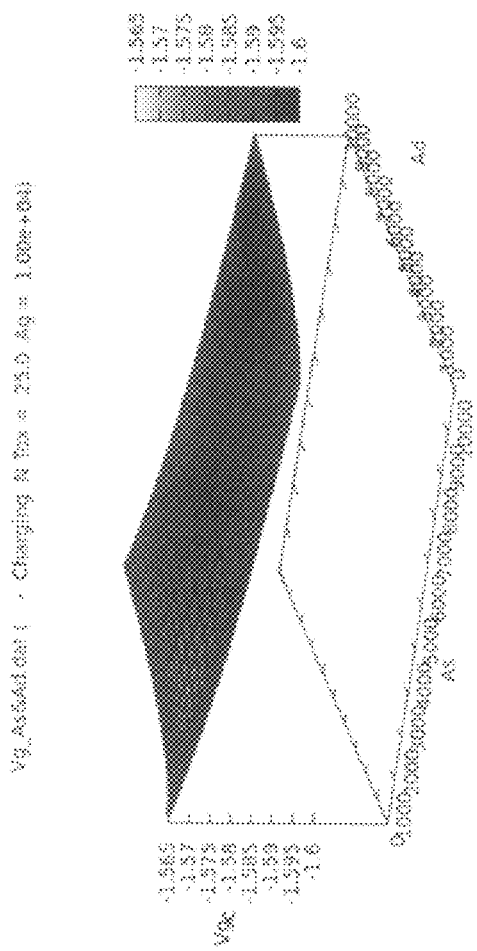
Figure 15F:
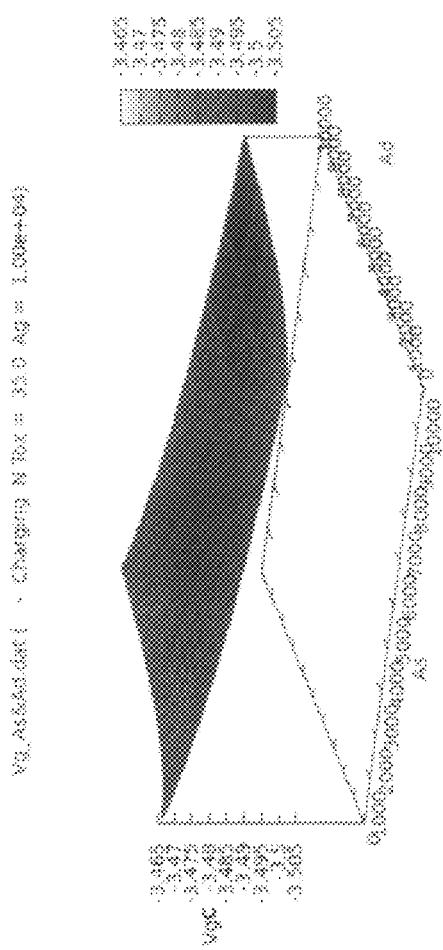
Figure 15G:
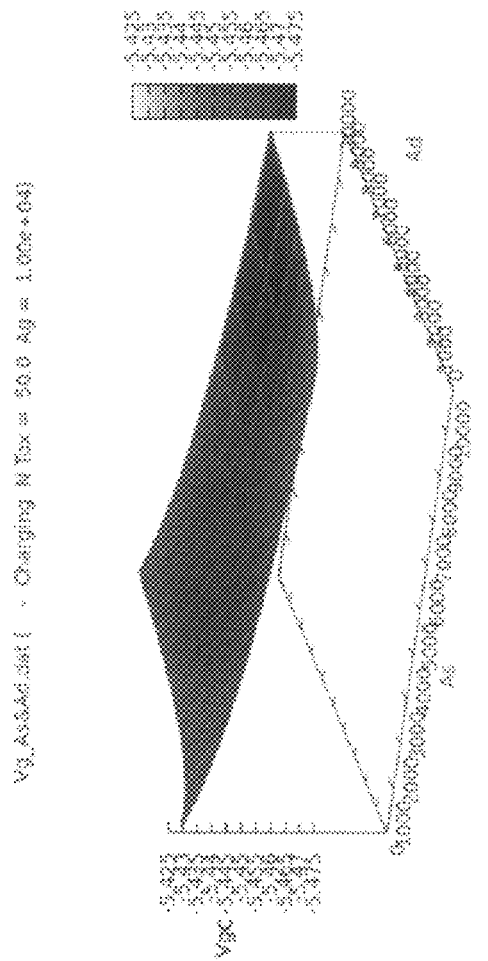
Figure 15H:
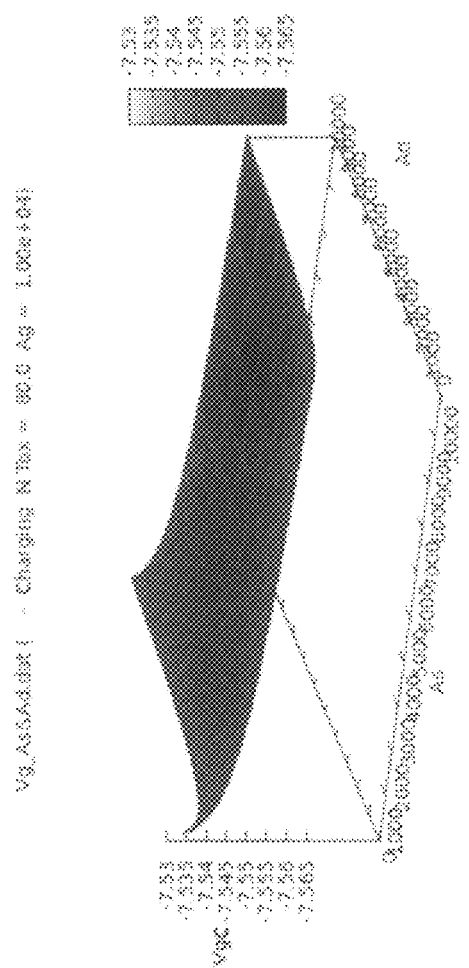
Figure 15I:
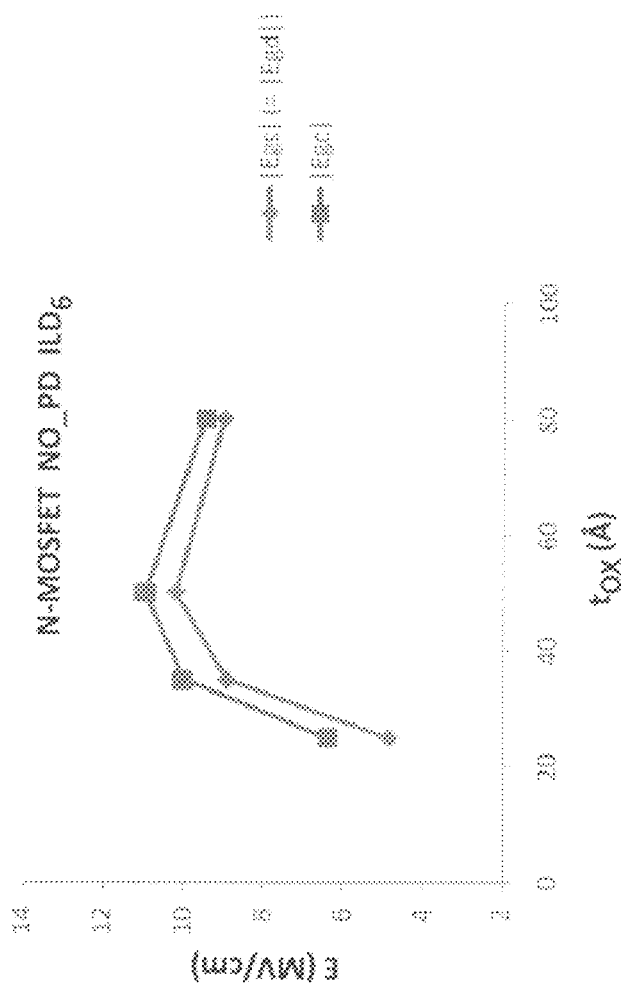

FIG. 15(i) summarizes the maximum electric field of the gate oxide in the gate-to-source overlap region and in the gate-to-channel overlap region versus the transistor gate oxide thickness according to one embodiment of the present disclosure.

Figure 16A:
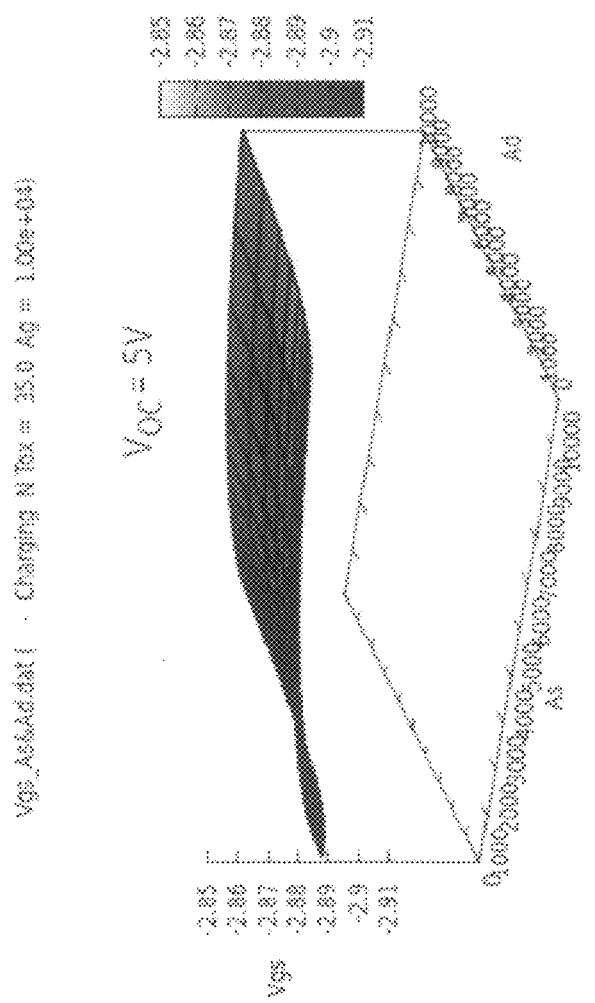
FIGS. 16($a$) to 16($c$) show Vgs versus the open-circuit voltage (Voc) of the plasma loading characteristics at 5, 30 and 80V, respectively.
Figure 16B:
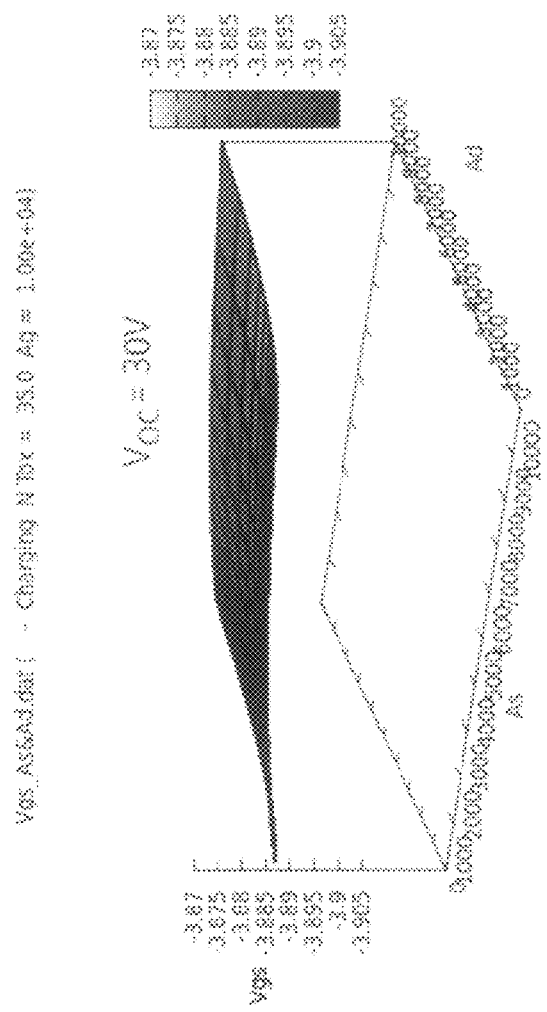
Figure 16C:
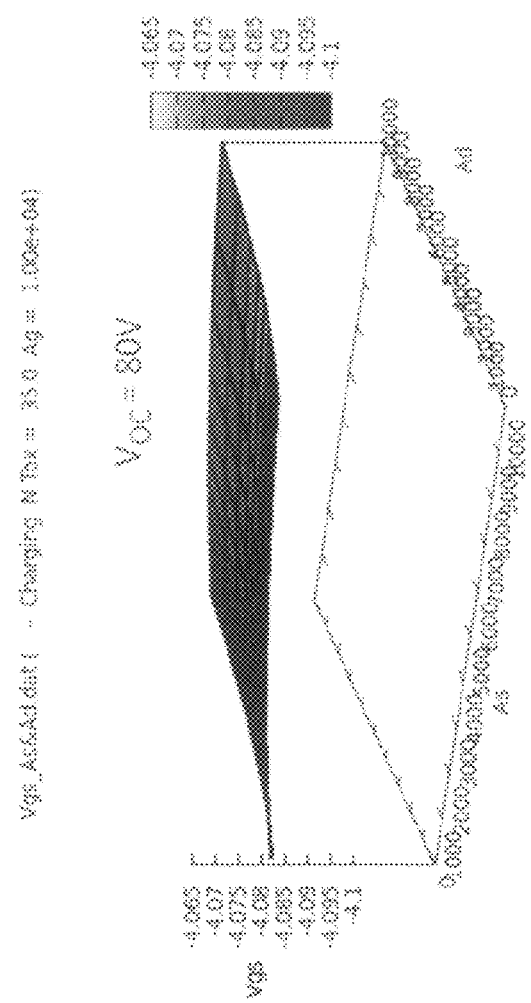
Figure 16D:
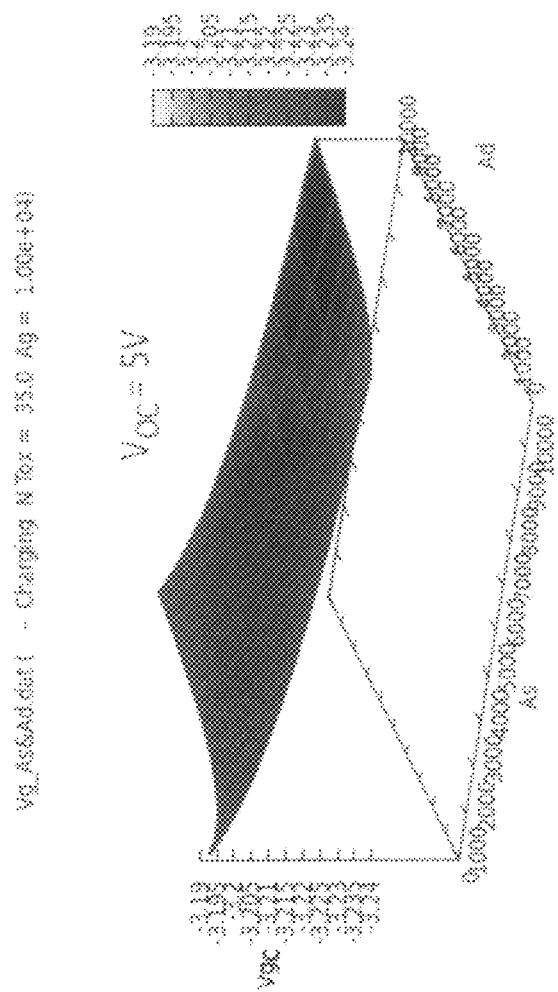
Figure 16E:
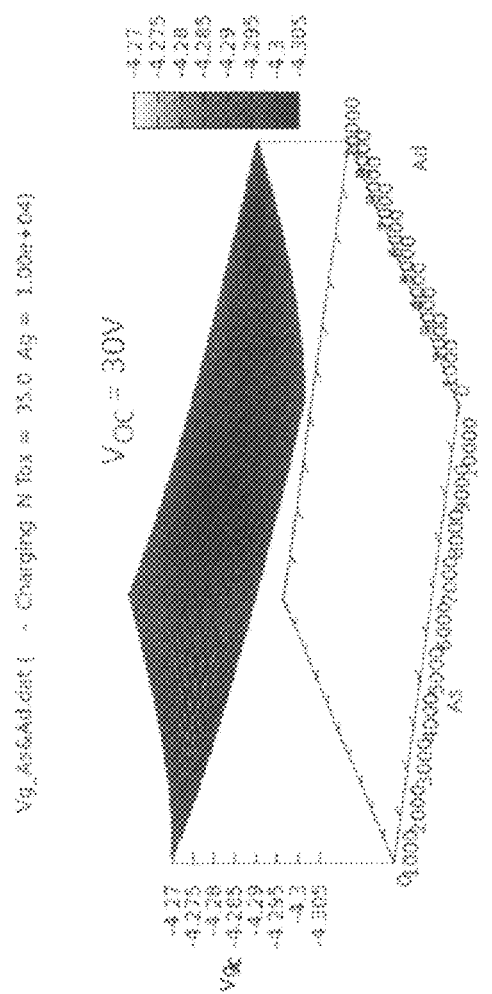
Figure 16F:
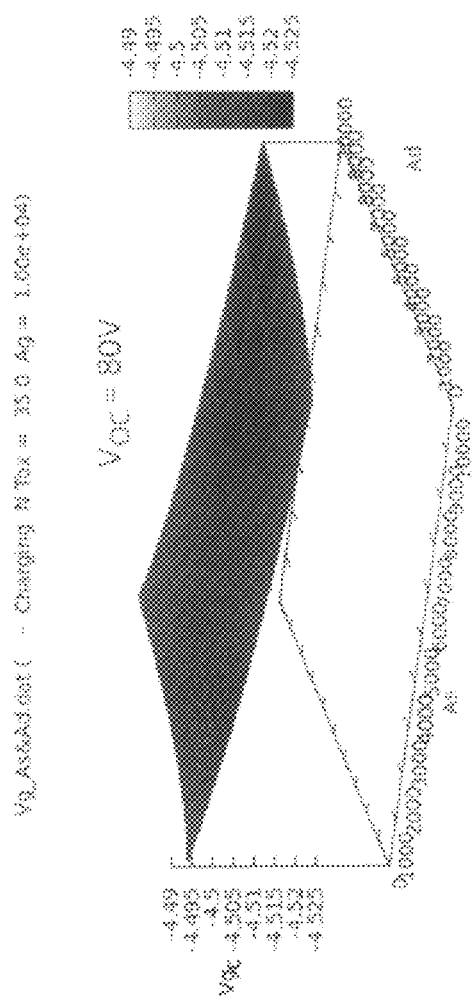

The plasma charging evaluator of the present disclosure may also be used for evaluating other effect associated with the transistor gate oxides. One example is to evaluate the effect of the plasma potential on the degradation of the transistor gate oxide. FIGS. 16(a) to 16(c) show Vgs versus the open-circuit voltage (Voc) of the plasma loading characteristics at 5, 30 and 80V, respectively. FIGS. 16(d) to 16(f) show Vgc versus VOC of the plasma loading characteristics at the same 5, 30, and 80V, respectively, as above. A linear plasma loading characteristics may be used during the simulations with JSC at $10^{-5}$ amp/cm$^2$. The gate oxide thickness of the simulated N-MOSFET is 35 Å. A "−" plasma charging event is considered during the simulation.

Figure 16G:
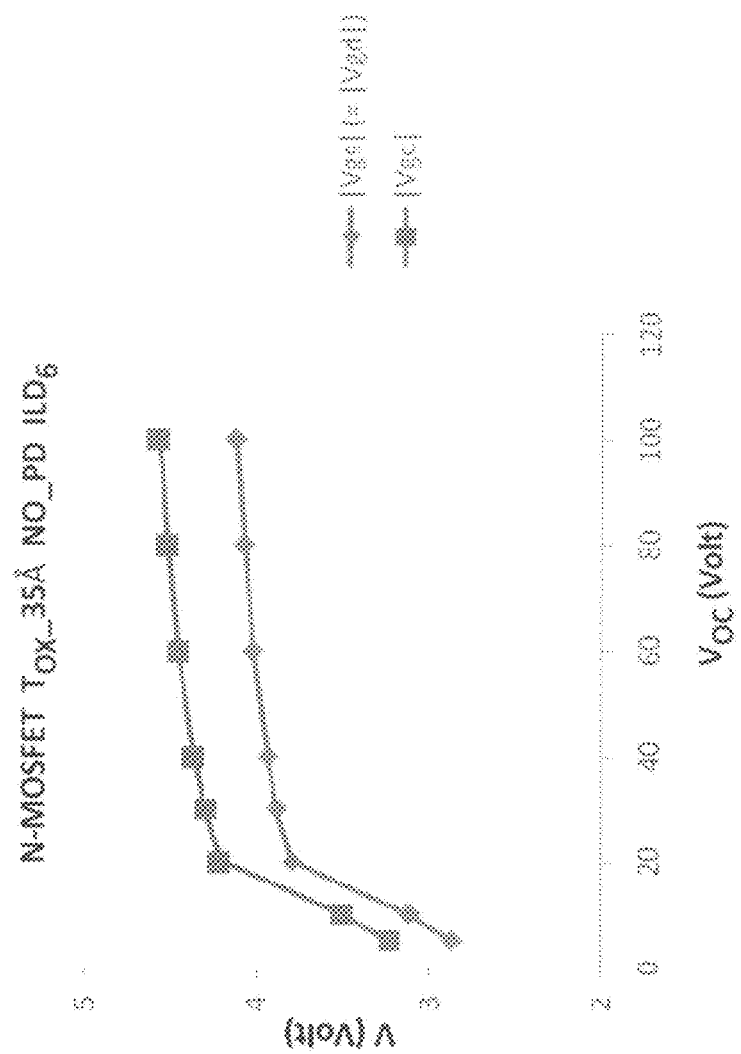

The above results may indicate that the higher plasma potential gives rise to the higher Vgs and Vgc. However, the trend tends to saturate. This is clearly indicated in the summarized plot shown in FIG. 16(g) showing between the gate oxide charging voltages (Vgs, Vgd and Vgc) and the plasma open-circuit voltage (Voc) where Voc is extended to 100V according to one embodiment of the present disclosure. Therefore, the highest potential across the gate oxide during any give plasma charging event may be limited. The origin of this limited effect may stem from the fact that the plasma current (hence the plasma voltage) coming into the N-MOSFET transistor is actually limited by the internal currents inside the transistors. The simulations of the present disclosure may indicate that during the "−" plasma charging event, the N-MOSFET transistor is driven into the accumulation condition (i.e., Vg−Vs<<Vt), where the small currents in the transistor may dictate the transistor's terminal characteristics. The small transistor internal leakage currents dominate and regulate the plasma current and hence the terminal potential of the transistor.

As such, the transistor may be always off and the drain and source terminals may virtually isolated and become independent. This may cause the simulated Vs and Vgs to be more affected by Vs, and the simulated Vd and Vgd more affected by Vd. For an N-MOSFET transistor exposed to a "−" plasma charging event, the transistor is either driven into the deep accumulation when its gate is floating or the weak accumulation when its gate is protected.

During the IC backend interconnect patterning process, the source terminal of the transistor may be floating until the patterning process reaches nearly or at the highest interconnect layer where the source terminal may be connected to the substrate through a VSS bus line, normally laid at the final (i.e., highest) interconnect layer. Thus, with the simulation results here it is clear that the transistor going through the above mentioned interconnect patterning process may be into accumulation condition. The inversion condition of the transistors may occur when the VSS bus line has been patterned, occurring usually at the highest interconnect layer and, and as a result, the source terminal may begin to be tied to the transistor substrate, which would then lead to low Vs or high Vgs.

In view of above, despite a P-MOSFET transistor structure is used to describe and demonstrate the performance, capability and applications of the plasma charging evaluator of the present disclosure, its performance, capability and application may equally well apply to other types of transistors including the N-MOSFET transistors.

The present disclosure may be practiced as a software invention, implemented in the form of a machine-readable medium having stored thereon at least one sequence of instructions that, when executed, causes a machine to effect the invention. With respect to the term "machine," such term should be construed broadly as encompassing all types of machines, e.g., a non-exhaustive listing including: computing machines, non-computing machines, communication machines, etc. Similarly, with respect to the term "machine-readable," such term should be construed broadly as encompassing a broad spectrum of mediums, e.g., a non-exhaustive listing including: magnetic medium (floppy disks, hard disks, magnetic tapes, etc.), optical medium (CD-ROMs, DVD-ROMs, etc.), flash-based medium (EPROM Flash memories, EPROM Flash hard disks, etc.), etc.

Figure 17:
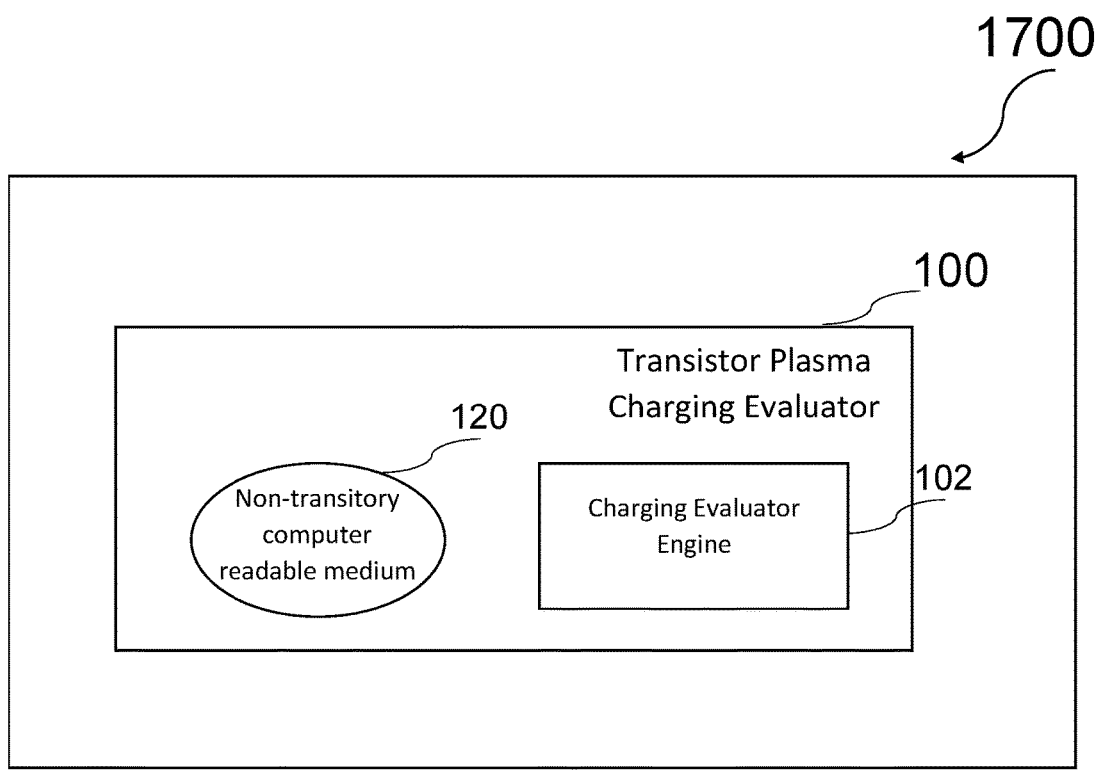
FIG. 17 is a simplistic illustration for a computer system comprising a transistor plasma charging evaluator which further comprises a charging evaluator engine and a non-transitory computer readable medium.

The present disclosuer may be implemented as a computer system that is capable of evaluating the plasma-induced charging effect to transistors of an integrated circuit design. In a simplistic illustration shown in FIG. 17, this computer system 1700 may include the transistor plasma charging evaluator 100 which further includes the charging evaluator engine 102 and a non-transitory computer readable medium 120.

Although specific embodiments have been illustrated and described herein for purposes of description, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein.

Some modifications of these examples, as well as other possibility will, on reading or having read this description, or having comprehended these examples, will occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. A computer-implemented method capable of evaluating a plasma-induced charging effect to a transistor of an integrated circuit design in a plasma-based process for a dielectric layer performed on a metal layer above the transistor, comprising:
  a non-transitory computer readable medium comprising
    a set of computer instructions when executed by a computer system causing the system to execute the tasks;
  a charging evaluator engine incorporating comprehensive physical models governing multiple-terminal transistor plasma-charging behaviors wherein the comprehensive physical models include advanced compact transistor models, transistor gate oxide currents models, and transistor internal current models in the regions including source-to-substrate, source-to-N-well, drain-to-substrate; drain-to-N-well and NW-to-substrate junction, and depletion region underneath the gate channel;
  the charging evaluator engine further comprising
    receive parameters relating to the models of the transistor, a plasma and an interconnect characteristics;
    assigning initial potentials to terminals of the modeled transistor;
    calculating final potentials at the terminals of the modeled transistor;
    determining a degradation state of the transistor according to the final potentials at the terminals of the modeled transistor; and
  performing manufacturing process of the integrated circuit design using the final tuned model based process parameters associated with the transistor, the plasma and the interconnect.

2. The computer-implemented method according to claim 1, further comprising designating the degradation state of the transistor to be susceptible to degradation when the degradation threshold of the transistor is exceeded.

3. The computer-implemented method according to claim 1, wherein the transistor characteristics include a transistor type, a transistor internal and external physical features, a transistor model parameters, a transistor leakage related parameters associated with its internal features, a transistor external connectivity and associated parameters, a transistor gate oxide thickness, a transistor gate-oxide leakage behavior, a transistor gate oxide degradation threshold, and an option for connecting a protection device at the transistor gate.

4. The computer-implemented method according to claim 1, wherein the plasma characteristics include a polarity of a plasma source, a plasma loading characteristics as a function of the plasma power, plasma illumination intensity and associated parameters.

5. The computer-implemented method according to claim 1, wherein the interconnect characteristics include a number of interconnect metal layers, a features and connectivity of interconnect metals, a thickness and property of each of the inter-metal-layer dielectrics layers, and associated parameters of interconnect metals and dielectrics.

6. A computer system capable of evaluating a plasma-induced charging effect to a transistor of an integrated circuit design in a plasma-based process for a dielectric layer performed on a metal layer above the transistor, comprising a transistor plasma charging evaluator, wherein the transistor plasma charging evaluator comprising:
  a non-transitory computer readable medium comprising
    a set of computer instructions when executed by a computer system causing the system to execute the tasks;
  a charging evaluator engine incorporating comprehensive physical models governing multiple-terminal transistor plasma-charging behaviors wherein the comprehensive physical models include advanced compact transistor models, transistor gate oxide currents models, and transistor internal current models in the regions including source-to-substrate, source-to-N-well, drain-to-substrate, drain-to-N-well and NW-to-substrate junction, and depletion region underneath the gate channel;
  the charging evaluator engine further comprising
    receive parameters relating to the models of the transistor, a plasma and an interconnect characteristics;
    assigning initial potentials to terminals of the modeled transistor;
    calculating final potentials at the terminals of the modeled transistor;
    determining a degradation state of the transistor according to the final potentials at the terminals of the modeled transistor; and
  performing manufacturing process of the integrated circuit design using the final tuned model based process parameters associated with the transistor, the plasma and the interconnect.

7. The computer system according to claim 6, wherein the plasma-based process comprises growing the dielectric layer and etching the dielectric layer.

8. The computer system according to claim 6, wherein the charging simulation engine is further adapted to designate the degradation state of the transistor to be susceptible to degradation when the degradation threshold of the transistor is exceeded.

9. The computer system according to claim 6, wherein the transistor characteristics include a transistor type, a transistor internal and external physical features, a transistor model parameters, a transistor leakage related parameters associated with its internal features, a transistor external connectivity and associated parameters, a transistor gate oxide thickness, a transistor leakage behavior, a transistor gate oxide degradation threshold, and an option for connecting a protection device at the transistor gate.

10. The computer system according to claim 6, wherein the plasma characteristics include a polarity of a plasma source, a plasma loading characteristics as a function of the plasma power, plasma illumination intensity and associated parameters.

11. The computer system according to claim 6, wherein the interconnect characteristics include a number of interconnect metal layers, a features and connectivity of interconnect metals, a thickness and property of each of the inter-metal-layer dielectrics, and associated parameters of interconnect metals and dielectrics.

* * * * *